(12) United States Patent
Affinito et al.

(10) Patent No.: US 9,040,197 B2
(45) Date of Patent: May 26, 2015

(54) ELECTRODE STRUCTURE AND METHOD FOR MAKING THE SAME

(71) Applicant: Sion Power Corporation, Tucson, AZ (US)

(72) Inventors: John D. Affinito, Tucson, AZ (US); Gregory K. Lowe, Tucson, AZ (US)

(73) Assignee: Sion Power Corporation, Tucson, AZ (US)

( * ) Notice: Subject to any disclaimer, the term of this patent is extended or adjusted under 35 U.S.C. 154(b) by 0 days.

(21) Appl. No.: 13/850,437

(22) Filed: Mar. 26, 2013

(65) Prior Publication Data

US 2013/0216915 A1  Aug. 22, 2013

Related U.S. Application Data

(63) Continuation of application No. 13/644,933, filed on Oct. 4, 2012.

(60) Provisional application No. 61/546,685, filed on Oct. 13, 2011.

(51) Int. Cl.
*H01M 4/38* (2006.01)
*H01M 4/13* (2010.01)
(Continued)

(52) U.S. Cl.
CPC ............... *H01M 4/382* (2013.01); *H01M 4/13* (2013.01); *H01M 10/056* (2013.01); *C23C 14/00* (2013.01); *H01M 4/0426* (2013.01); *H01M 4/134* (2013.01); *H01M 4/1395* (2013.01); *H01M 4/366* (2013.01); *H01M 10/052* (2013.01);
(Continued)

(58) Field of Classification Search
None
See application file for complete search history.

(56) References Cited

U.S. PATENT DOCUMENTS

| 1,956,243 A | 4/1934 | McEachron et al. |
| 3,716,409 A | 2/1973 | Cairns et al. |

(Continued)

FOREIGN PATENT DOCUMENTS

| CN | 1121264 A | 4/1996 |
| CN | 1430304 A | 7/2003 |

(Continued)

OTHER PUBLICATIONS

International Search Report and Written Opinion for PCT/US2012/058718 mailed Feb. 14, 2013.

(Continued)

*Primary Examiner* — Patrick Ryan
*Assistant Examiner* — Haixia Zhang
(74) *Attorney, Agent, or Firm* — Wolf, Greenfield & Sacks, P.C.

(57) ABSTRACT

Electrode structures, and more specifically, electrode structures for use in electrochemical cells, are provided. The electrode structures described herein may include one or more protective layers. In one set of embodiments, a protective layer may be formed by exposing a lithium metal surface to a plasma comprising ions of a gas to form a ceramic layer on top of the lithium metal. The ceramic layer may be highly conductive to lithium ions and may protect the underlying lithium metal surface from reaction with components in the electrolyte. In some cases, the ions may be nitrogen ions and a lithium nitride layer may be formed on the lithium metal surface. In other embodiments, the protective layer may be formed by converting lithium to lithium nitride at high pressures. Other methods for forming protective layers are also provided.

27 Claims, 3 Drawing Sheets

(51) Int. Cl.
*H01M 10/056* (2010.01)
*C23C 14/00* (2006.01)
*H01M 4/04* (2006.01)
*H01M 4/134* (2010.01)
*H01M 4/1395* (2010.01)
*H01M 4/36* (2006.01)
*H01M 10/052* (2010.01)
*H01M 10/0565* (2010.01)

(52) U.S. Cl.
CPC .......... *H01M 10/0565* (2013.01); *Y02E 60/122* (2013.01)

(56) References Cited

U.S. PATENT DOCUMENTS

| | | |
|---|---|---|
| 3,833,421 A | 9/1974 | Rubischko et al. |
| 3,907,579 A | 9/1975 | Ravault |
| 3,951,689 A | 4/1976 | Ludwig |
| 3,957,532 A | 5/1976 | Settle et al. |
| 4,002,492 A | 1/1977 | Rao |
| 4,011,374 A | 3/1977 | Kaun |
| 4,056,885 A | 11/1977 | Rao |
| 4,063,005 A | 12/1977 | Mamantov et al. |
| 4,169,120 A | 9/1979 | Miller |
| 4,184,013 A | 1/1980 | Weddigen et al. |
| 4,235,528 A | 11/1980 | Yano et al. |
| 4,330,601 A | 5/1982 | Dey |
| 4,339,325 A | 7/1982 | Solomon et al. |
| 4,384,029 A | 5/1983 | Kordesch et al. |
| 4,410,609 A | 10/1983 | Peled et al. |
| 4,517,265 A | 5/1985 | Belanger et al. |
| 4,556,618 A | 12/1985 | Shia |
| 4,652,506 A | 3/1987 | Belanger et al. |
| 4,664,991 A | 5/1987 | Perichaud et al. |
| 4,677,415 A | 6/1987 | Howng |
| 4,683,178 A | 7/1987 | Stadnick et al. |
| 4,690,840 A | 9/1987 | Gauthier et al. |
| 4,739,018 A | 4/1988 | Armand et al. |
| 4,770,956 A | 9/1988 | Knoedler |
| 4,794,060 A | 12/1988 | Belanger et al. |
| 4,833,048 A | 5/1989 | Dejonghe et al. |
| 4,917,974 A | 4/1990 | Dejonghe et al. |
| 4,954,371 A | 9/1990 | Yializis |
| H858 H | 12/1990 | Leonard et al. |
| 5,126,082 A | 6/1992 | Frank |
| 5,162,175 A | 11/1992 | Visco et al. |
| 5,194,341 A | 3/1993 | Bagley et al. |
| 5,278,005 A | 1/1994 | Yamauchi et al. |
| 5,314,765 A | 5/1994 | Bates et al. |
| 5,324,599 A | 6/1994 | Oyama et al. |
| 5,328,946 A | 7/1994 | Tuminello et al. |
| 5,366,829 A | 11/1994 | Saidi |
| 5,387,479 A | 2/1995 | Koksbang |
| 5,415,954 A | 5/1995 | Gauthier |
| 5,433,917 A | 7/1995 | Srivastava et al. |
| 5,434,021 A | 7/1995 | Fauteux et al. |
| 5,441,831 A | 8/1995 | Okamoto et al. |
| 5,460,905 A | 10/1995 | Skotheim |
| 5,462,566 A | 10/1995 | Skotheim |
| 5,487,959 A | 1/1996 | Koksbang |
| 5,516,598 A | 5/1996 | Visco et al. |
| 5,528,920 A | 6/1996 | Bouchard et al. |
| 5,529,860 A | 6/1996 | Skotheim et al. |
| 5,532,083 A | 7/1996 | McCullough |
| 5,538,812 A | 7/1996 | Lee et al. |
| 5,569,520 A | 10/1996 | Bates |
| 5,582,623 A | 12/1996 | Chu |
| 5,601,947 A | 2/1997 | Skotheim et al. |
| 5,614,331 A | 3/1997 | Takeuchi et al. |
| 5,620,792 A | 4/1997 | Challener |
| 5,648,187 A | 7/1997 | Skotheim et al. |
| 5,681,615 A | 10/1997 | Affinito et al. |
| 5,686,201 A | 11/1997 | Chu |
| 5,690,702 A | 11/1997 | Skotheim et al. |
| 5,693,432 A | 12/1997 | Matsumoto |
| 5,698,339 A | 12/1997 | Kawakami et al. |
| 5,716,736 A | 2/1998 | Zhang et al. |
| 5,723,230 A | 3/1998 | Naoi et al. |
| 5,731,104 A | 3/1998 | Ventura et al. |
| 5,783,330 A | 7/1998 | Naoi et al. |
| 5,786,092 A | 7/1998 | Lorenzo et al. |
| 5,792,575 A | 8/1998 | Naoi et al. |
| 5,814,420 A | 9/1998 | Chu |
| 5,824,434 A | 10/1998 | Kawakami et al. |
| 5,834,137 A | 11/1998 | Zhang et al. |
| 5,837,401 A | 11/1998 | Gauthier et al. |
| 5,882,819 A | 3/1999 | Naoi et al. |
| 5,895,732 A | 4/1999 | Clough |
| 5,961,672 A | 10/1999 | Skotheim et al. |
| 5,989,467 A | 11/1999 | Daws et al. |
| 5,998,063 A | 12/1999 | Kobayashi et al. |
| 6,019,801 A | 2/2000 | Gauthier et al. |
| 6,020,412 A | 2/2000 | Muschelewicz et al. |
| 6,025,094 A * | 2/2000 | Visco et al. ............. 429/231.95 |
| 6,030,720 A | 2/2000 | Chu et al. |
| 6,066,417 A | 5/2000 | Cho et al. |
| 6,110,417 A | 8/2000 | Sugikawa |
| 6,110,621 A | 8/2000 | Sandi et al. |
| 6,117,590 A | 9/2000 | Skotheim et al. |
| 6,120,930 A | 9/2000 | Rouillard et al. |
| 6,136,468 A | 10/2000 | Mitchell, Jr. et al. |
| 6,143,216 A | 11/2000 | Loch et al. |
| 6,153,337 A | 11/2000 | Carlson et al. |
| 6,156,395 A | 12/2000 | Zhang et al. |
| 6,165,645 A | 12/2000 | Nishimura et al. |
| 6,168,694 B1 | 1/2001 | Huang et al. |
| 6,183,901 B1 | 2/2001 | Ying et al. |
| 6,200,704 B1 | 3/2001 | Katz et al. |
| 6,201,100 B1 | 3/2001 | Gorkovenko et al. |
| 6,202,591 B1 | 3/2001 | Witzman et al. |
| 6,203,947 B1 | 3/2001 | Peled et al. |
| 6,214,061 B1 | 4/2001 | Visco et al. |
| 6,225,002 B1 | 5/2001 | Nimon et al. |
| 6,268,695 B1 | 7/2001 | Affinito |
| 6,276,355 B1 | 8/2001 | Zhang et al. |
| 6,277,514 B1 | 8/2001 | Ying et al. |
| 6,284,412 B1 | 9/2001 | Minakata et al. |
| 6,306,545 B1 | 10/2001 | Carlson et al. |
| 6,328,770 B1 | 12/2001 | Gozdz |
| 6,358,643 B1 | 3/2002 | Katz et al. |
| 6,395,423 B1 | 5/2002 | Kawakami et al. |
| 6,402,795 B1 | 6/2002 | Chu et al. |
| 6,403,261 B2 | 6/2002 | Mitkin et al. |
| 6,413,284 B1 | 7/2002 | Chu et al. |
| 6,413,645 B1 | 7/2002 | Graff et al. |
| 6,508,921 B1 | 1/2003 | Mu et al. |
| 6,517,590 B1 | 2/2003 | Gauthier et al. |
| 6,517,968 B2 | 2/2003 | Johnson et al. |
| 6,528,211 B1 | 3/2003 | Nishimura et al. |
| 6,537,701 B1 | 3/2003 | Nimon et al. |
| 6,558,847 B1 | 5/2003 | Kawakami et al. |
| 6,570,325 B2 | 5/2003 | Graff et al. |
| 6,680,013 B1 | 1/2004 | Stein et al. |
| 6,706,449 B2 | 3/2004 | Mikhaylik et al. |
| 6,723,140 B2 | 4/2004 | Chu et al. |
| 6,733,924 B1 | 5/2004 | Skotheim et al. |
| 6,753,036 B2 | 6/2004 | Jankowski et al. |
| 6,770,187 B1 | 8/2004 | Putter et al. |
| 6,797,428 B1 | 9/2004 | Skotheim et al. |
| 6,835,493 B2 | 12/2004 | Zhang et al. |
| 6,852,139 B2 | 2/2005 | Zhang et al. |
| 6,854,312 B2 | 2/2005 | Laliberte et al. |
| 6,886,240 B2 | 5/2005 | Zhang et al. |
| 6,913,998 B2 | 7/2005 | Jankowski et al. |
| 6,914,111 B2 | 7/2005 | Mukoyama et al. |
| 6,936,381 B2 | 8/2005 | Skotheim et al. |
| 6,991,662 B2 | 1/2006 | Visco et al. |
| 7,029,796 B2 | 4/2006 | Choi et al. |
| 7,129,005 B2 | 10/2006 | Wensley et al. |
| 7,141,281 B2 | 11/2006 | Hirota et al. |
| 7,157,185 B2 | 1/2007 | Marple |
| 7,204,862 B1 | 4/2007 | Zhang et al. |
| 7,241,535 B2 | 7/2007 | Kim et al. |

(56) References Cited

U.S. PATENT DOCUMENTS

| | | |
|---|---|---|
| 7,244,530 B2 | 7/2007 | Hambitzer et al. |
| 7,247,408 B2 | 7/2007 | Skotheim et al. |
| 7,250,233 B2 | 7/2007 | Choi et al. |
| 7,354,675 B2 | 4/2008 | Molter |
| 7,354,680 B2 | 4/2008 | Mikhaylik |
| 7,358,012 B2 | 4/2008 | Mikhaylik |
| 7,361,431 B2 | 4/2008 | Kim et al. |
| 7,553,584 B2 | 6/2009 | Chiang et al. |
| 7,553,590 B2 | 6/2009 | Mikhaylik |
| 7,579,112 B2 | 8/2009 | Chiang et al. |
| 7,629,083 B2 | 12/2009 | Cho et al. |
| 7,646,171 B2 | 1/2010 | Mikhaylik |
| 7,771,870 B2 | 8/2010 | Affinito et al. |
| 7,785,730 B2 | 8/2010 | Affinito et al. |
| 7,842,421 B2 | 11/2010 | Mikhaylik |
| 8,076,024 B2 | 12/2011 | Affinito et al. |
| 8,087,309 B2 | 1/2012 | Kelley et al. |
| 8,105,717 B2 | 1/2012 | Skotheim et al. |
| 8,137,525 B1 | 3/2012 | Harreld et al. |
| 8,197,971 B2 | 6/2012 | Skotheim et al. |
| 8,338,034 B2 | 12/2012 | Affinito et al. |
| 8,415,054 B2 | 4/2013 | Skotheim et al. |
| 8,936,870 B2 | 1/2015 | Affinito et al. |
| 2001/0014420 A1 | 8/2001 | Takeuchi et al. |
| 2001/0024749 A1 | 9/2001 | Michot et al. |
| 2001/0034934 A1 | 11/2001 | Xu et al. |
| 2001/0041294 A1 | 11/2001 | Chu et al. |
| 2002/0006552 A1* | 1/2002 | Ishida et al. ............ 429/303 |
| 2002/0012846 A1 | 1/2002 | Skotheim et al. |
| 2002/0018933 A1 | 2/2002 | Mitkin et al. |
| 2002/0071989 A1 | 6/2002 | Verma |
| 2002/0119351 A1 | 8/2002 | Ovshinsky et al. |
| 2002/0182508 A1 | 12/2002 | Nimon et al. |
| 2002/0187398 A1 | 12/2002 | Mikhaylik et al. |
| 2002/0192557 A1 | 12/2002 | Choi et al. |
| 2003/0073000 A1 | 4/2003 | Lee et al. |
| 2003/0082446 A1 | 5/2003 | Chiang et al. |
| 2003/0099884 A1 | 5/2003 | Chiang et al. |
| 2003/0108785 A1 | 6/2003 | Wu et al. |
| 2003/0113622 A1 | 6/2003 | Blasi et al. |
| 2003/0113624 A1 | 6/2003 | Kim et al. |
| 2003/0124416 A1 | 7/2003 | Kaneta |
| 2003/0180611 A1 | 9/2003 | Mikhaylik et al. |
| 2003/0222048 A1 | 12/2003 | Asakawa et al. |
| 2003/0224234 A1 | 12/2003 | Steele et al. |
| 2004/0037771 A1 | 2/2004 | Meissner et al. |
| 2004/0047798 A1 | 3/2004 | Oh et al. |
| 2004/0072066 A1* | 4/2004 | Cho et al. ............... 429/137 |
| 2004/0118698 A1 | 6/2004 | Lu et al. |
| 2004/0131944 A1 | 7/2004 | Visco et al. |
| 2004/0142244 A1 | 7/2004 | Visco et al. |
| 2004/0175621 A1 | 9/2004 | Iriyama et al. |
| 2004/0191607 A1 | 9/2004 | Nobuta et al. |
| 2004/0197641 A1* | 10/2004 | Visco et al. ............ 429/137 |
| 2004/0214088 A1 | 10/2004 | Lee et al. |
| 2004/0234851 A1 | 11/2004 | Kim et al. |
| 2005/0042515 A1 | 2/2005 | Hwang et al. |
| 2005/0048371 A1 | 3/2005 | Nagayama et al. |
| 2005/0051763 A1 | 3/2005 | Affinito et al. |
| 2005/0061047 A1 | 3/2005 | Laliberte et al. |
| 2005/0079420 A1 | 4/2005 | Cho et al. |
| 2005/0100793 A1 | 5/2005 | Jonghe et al. |
| 2005/0130041 A1 | 6/2005 | Fensore |
| 2005/0131126 A1 | 6/2005 | Yang et al. |
| 2005/0147886 A1 | 7/2005 | Mikhaylik |
| 2005/0156575 A1 | 7/2005 | Mikhaylik |
| 2005/0158535 A1 | 7/2005 | Zhang et al. |
| 2005/0175904 A1 | 8/2005 | Gorkovenko |
| 2005/0186469 A1 | 8/2005 | De Jonghe et al. |
| 2005/0196677 A1 | 9/2005 | Lee et al. |
| 2005/0208353 A1 | 9/2005 | Johnson |
| 2005/0234177 A1 | 10/2005 | Zaghib et al. |
| 2005/0266990 A1 | 12/2005 | Iwasaki et al. |
| 2006/0024579 A1 | 2/2006 | Kolosnitsyn et al. |
| 2006/0051677 A1 | 3/2006 | Matsushima et al. |
| 2006/0057464 A1 | 3/2006 | Kim et al. |
| 2006/0115579 A1 | 6/2006 | Mukherjee et al. |
| 2006/0194096 A1 | 8/2006 | Valle et al. |
| 2006/0222954 A1 | 10/2006 | Skotheim et al. |
| 2006/0234117 A1 | 10/2006 | Fujikawa et al. |
| 2006/0238203 A1 | 10/2006 | Kelley et al. |
| 2006/0246354 A1 | 11/2006 | Lee et al. |
| 2007/0065701 A1 | 3/2007 | Cable et al. |
| 2007/0117007 A1 | 5/2007 | Visco et al. |
| 2007/0172739 A1* | 7/2007 | Visco et al. ............ 429/322 |
| 2007/0207370 A1 | 9/2007 | Kwak et al. |
| 2007/0212583 A1 | 9/2007 | Johnson |
| 2007/0221265 A1 | 9/2007 | Affinito et al. |
| 2007/0289495 A1 | 12/2007 | Cray et al. |
| 2008/0014501 A1 | 1/2008 | Skotheim et al. |
| 2008/0070087 A1 | 3/2008 | Johnson |
| 2008/0100264 A1 | 5/2008 | Kolosnitsyn et al. |
| 2008/0187663 A1 | 8/2008 | Affinito |
| 2008/0213672 A1 | 9/2008 | Skotheim et al. |
| 2008/0246580 A1 | 10/2008 | Braun et al. |
| 2008/0318128 A1 | 12/2008 | Simoneau et al. |
| 2009/0053607 A1 | 2/2009 | Jeong et al. |
| 2009/0077794 A1 | 3/2009 | Hirakawa et al. |
| 2009/0098457 A1 | 4/2009 | Kwon et al. |
| 2009/0159853 A1 | 6/2009 | Sengupta et al. |
| 2009/0200986 A1 | 8/2009 | Kopera et al. |
| 2009/0311604 A1 | 12/2009 | Nazar et al. |
| 2010/0035128 A1 | 2/2010 | Scordilis-Kelley et al. |
| 2010/0068623 A1 | 3/2010 | Braun et al. |
| 2010/0104948 A1 | 4/2010 | Skotheim et al. |
| 2010/0129699 A1 | 5/2010 | Mikhaylik et al. |
| 2010/0143823 A1 | 6/2010 | Tanaka et al. |
| 2010/0239914 A1 | 9/2010 | Mikhaylik et al. |
| 2010/0285360 A1 | 11/2010 | Kozinsky et al. |
| 2010/0291442 A1 | 11/2010 | Wang et al. |
| 2011/0008531 A1 | 1/2011 | Mikhaylik et al. |
| 2011/0014524 A1 | 1/2011 | Skotheim et al. |
| 2011/0045346 A1 | 2/2011 | Chiang et al. |
| 2011/0059361 A1 | 3/2011 | Wilkening et al. |
| 2011/0068001 A1 | 3/2011 | Affinito et al. |
| 2011/0070491 A1 | 3/2011 | Campbell et al. |
| 2011/0070494 A1 | 3/2011 | Campbell et al. |
| 2011/0076560 A1 | 3/2011 | Scordilis-Kelley et al. |
| 2011/0159376 A1 | 6/2011 | Skotheim et al. |
| 2011/0177398 A1 | 7/2011 | Affinito et al. |
| 2011/0200868 A1 | 8/2011 | Klaassen |
| 2011/0206992 A1 | 8/2011 | Campbell et al. |
| 2011/0256450 A1 | 10/2011 | Campbell et al. |
| 2012/0043940 A1 | 2/2012 | Affinito et al. |
| 2012/0048729 A1 | 3/2012 | Mikhaylik et al. |
| 2012/0070746 A1 | 3/2012 | Mikhaylik et al. |
| 2012/0082872 A1 | 4/2012 | Schmidt et al. |
| 2012/0276449 A1 | 11/2012 | Skotheim et al. |
| 2013/0017441 A1 | 1/2013 | Affinito et al. |
| 2013/0095380 A1 | 4/2013 | Affinito et al. |
| 2013/0224601 A1 | 8/2013 | Burnside et al. |
| 2013/0252103 A1 | 9/2013 | Mikhaylik et al. |
| 2013/0316072 A1 | 11/2013 | Scordilis-Kelley et al. |

FOREIGN PATENT DOCUMENTS

| | | |
|---|---|---|
| CN | 1534811 A | 10/2004 |
| CN | 1574427 | 2/2005 |
| CN | 1874027 A | 12/2006 |
| CN | 101026247 | 8/2007 |
| DE | 199 16 043 A1 | 10/2000 |
| DE | 101 28 970 A1 | 12/2002 |
| EP | 0 700 109 A1 | 3/1996 |
| EP | 1 178 555 A2 | 2/2002 |
| EP | 1 717 879 A1 | 11/2006 |
| EP | 1 768 202 A1 | 3/2007 |
| GB | 1011353 A | 11/1965 |
| GB | 1 396 062 A | 5/1975 |
| JP | 59-130070 | 7/1984 |
| JP | 63-126156 | 5/1988 |
| JP | 4-028172 | 1/1992 |
| JP | 4-253159 A | 9/1992 |
| JP | 05-325978 A | 12/1993 |
| JP | 6-030246 | 4/1994 |

(56) References Cited

FOREIGN PATENT DOCUMENTS

| | | |
|---|---|---|
| JP | H06-124700 A | 5/1994 |
| JP | H07-017197 A | 1/1995 |
| JP | H08-267943 A | 10/1996 |
| JP | 09-147868 A | 6/1997 |
| JP | 09-279357 | 10/1997 |
| JP | 10-55823 A | 2/1998 |
| JP | H10-214638 A | 8/1998 |
| JP | H11-114481 A | 4/1999 |
| JP | H11-121045 A | 4/1999 |
| JP | H11-176423 A | 7/1999 |
| JP | H11-219731 A | 8/1999 |
| JP | 2000-040506 A | 2/2000 |
| JP | 2000-268873 A | 9/2000 |
| JP | 2001-093577 | 4/2001 |
| JP | 2001-143757 | 5/2001 |
| JP | 2002-363898 A | 12/2002 |
| JP | 2003-193110 A | 7/2003 |
| JP | 2003-297431 A | 10/2003 |
| JP | 2003-303588 A | 10/2003 |
| JP | 2004-213902 A | 7/2004 |
| JP | 2005-056701 A | 3/2005 |
| JP | 2005-063848 A | 3/2005 |
| JP | 2005-199190 A | 7/2005 |
| JP | 2005-251429 A | 9/2005 |
| JP | 2005-310836 A | 11/2005 |
| JP | 2005-353452 A | 12/2005 |
| JP | 2006-143478 A | 6/2006 |
| JP | 2006-155900 A | 6/2006 |
| JP | 2006-216565 A | 8/2006 |
| JP | 2006-236685 A | 9/2006 |
| JP | 2006-310033 A | 11/2006 |
| JP | 2006-310281 A | 11/2006 |
| JP | 2006-313737 A | 11/2006 |
| JP | 2006-318892 A | 11/2006 |
| JP | 2007-234338 A | 9/2007 |
| JP | 2007-257850 A | 10/2007 |
| JP | 2009-076260 A | 4/2009 |
| JP | 2009-104902 A | 5/2009 |
| JP | 2010-009856 A | 1/2010 |
| JP | 2010-055755 A | 3/2010 |
| JP | 2010055755 A * | 3/2010 |
| KR | 1020030027395 A | 4/2003 |
| KR | 10-0436712 B1 | 6/2004 |
| KR | 1020040090150 A | 10/2004 |
| KR | 10-0484642 B1 | 4/2005 |
| WO | WO 97/01870 A1 | 1/1997 |
| WO | WO 97/44840 A1 | 11/1997 |
| WO | WO 99/19931 A1 | 4/1999 |
| WO | WO 99/33125 A1 | 7/1999 |
| WO | WO 99/33130 A1 | 7/1999 |
| WO | WO 99/57770 A1 | 11/1999 |
| WO | WO 01/33651 A1 | 5/2001 |
| WO | WO 01/39302 A1 | 5/2001 |
| WO | WO 01/39303 A1 | 5/2001 |
| WO | WO 01/97304 A1 | 12/2001 |
| WO | WO 02/071989 A1 | 9/2002 |
| WO | WO 2005/038953 A1 | 4/2005 |
| WO | WO 2007/028972 A1 | 3/2007 |
| WO | WO 2007/097172 A1 | 8/2007 |
| WO | WO 2008/153749 A1 | 12/2008 |
| WO | WO 2009/017726 A1 | 2/2009 |
| WO | WO 2009/042071 A2 | 4/2009 |
| WO | WO 2009/054987 A1 | 4/2009 |
| WO | WO 2009/089018 A2 | 7/2009 |
| WO | WO 2009/114314 A2 | 9/2009 |
| WO | WO 2010/062391 A2 | 6/2010 |
| WO | WO 2010/074690 A1 | 7/2010 |
| WO | WO 2012/027457 A2 | 3/2012 |

OTHER PUBLICATIONS

Affinito et al., "A New Class of Ultra-Barrier Materials," 47th Annual Technical Conference Proceedings (2004) ISSN 0737-5921.

Affinito et al., "High Rate Process for Deposition of Plasma Polymerized Films from High Molecular Weight/Low Vapor Pressure Liquid or Solid Monomer Precursor," 2nd International Symposium on Plasma Polymerization/Deposition: Fundamental and Applied Aspects (1999).

Affinito et al., "High rate vacuum deposition of polymer electrolytes," J. Vac. Sci. Technol., A 14(3):733-8 (1996).

Alamgir et al., "Room Temperature Polymer Electrolytes," Lithium Batteries, New Materials, Developments and Perspectives, Chapter 3, pp. 93-136, Elsevier, Amsterdam (1994).

Dominey, "Current State of the Art on Lithium Battery Electrolytes," Lithium Batteries, New Materials, Developments and Perspectives, Chapter 4, pp. 137-165, Elsevier, Amsterdam (1994).

Storck, S. et al., "Characterization of micro- and mesoporous solids by physisorption methods and pore-size analysis", *Applied Catalysis A: General*, 174 (1998) 137-146.

Zhao et al., "A solid-state electrolyte lithium phosphorous oxynitride film prepared by pulsed laster deposition," Thin Solid Films, vol. 415, Issues 1-2, pp. 108-113 (Aug. 1, 2002).

Zhuang et al., "The Reaction of lithium with carbon dioxide studied by photoelectron spectroscopy," Surface Science, 418, pp. 139-149 (1998).

Schultz, Lithium: Measurement of Young's modulus and yield strength. Fermilab Technical Memo 2191. Nov. 2002. 5 pages.

International Preliminary Report on Patentability for PCT/US2012/058718 mailed Apr. 24, 2014.

[No Author Listed] Product Data Lists: Lithium metal, battery grade from Chemtall Foote Corporation. 2008. 2 pages.

[No Author Listed] Product Data Lists: Lithium metal, battery grade from LectroMax120 Anode Material for FMC Corporation. 2009. 2 pages.

Anonymous, Low aluminum content lithium alloy for disulfide nonaqueous battery. Research Disclosure Journal. 1994. Research Disclosure No. 364044. 2 pages.

Bae, J-S et al., "Study on diffusion and flow of benzene, n-hexane and CC14 in activated carbon by a differential permeation method," Chemical Engineering Science, 57 (2002) 3013-3024.

Brunauer et al., Adsorption of Gases in Multimolecular Layers. J Am Chem Soc. 1938;60(2):309-19.

Bunshah, Rointan F., Ed. Handbook of Deposition Technologies for Films and Coatings. Second Edition. New Jersey: Noyes Publications, 1994. 198-223, 706-719.

Campbell et al., Electrodeposition of Mesoporous Nickel onto Foamed Metals Using Surfactant and Polymer Templates. J Porous Mater. 2004;11(2):63-69.

Cheon et al., Capacity fading mechanisms on cycling a high-capacity secondary sulfur cathode. J Electrochem Soc. Oct. 29, 2004;151(12):A2067-73.

Cheon et al., Rechargeable lithium sulfur battery: II. Rate capability and cycle characteristics. J Electrochem Soc. May 5, 2003;150(6):A800-05.

Cunningham et al., Phase Equilibria in Lithium-Chalcogen Systems. J Electrochem Soc. 1972;119:1448-50.

Do., H.D. et al., "A new diffusion and flow theory for activated carbon from low pressure to capillary condensation range", Chemical Engineering Journal, 84 (2001) 295-308.

Doherty et al., Colloidal Crystal Templating to Produce Hierarchically Porous LiFePO4 Electrode Materials for High Power Lithium Ion Batteries. Chem Mater. 2009;21(13):2895-2903.

Garboczi, Permeability, diffusivity, and microstructural parameters: A critical review. Cement and Concrete Res. Jul. 1990;20(4):591-601.

Gireaud et al., Lithium metal stripping/plating mechanism studies: A metallurgical approach. Electrochemistry Communications. 2006;8:1639-49.

Gonzenbach et al., Macroporous ceramics from particle-stabilized wet foams. J Am Ceram Soc. 2007;90(1):16-22.

Graff et al., "Mechanisms of vapor permeation through multilayer barrier films: Lag time versus equilibrium permeation," Journal of Applied Physics, 96(4) (2004).

Gregg, S.J., et al, Adsorption, Surface Area and Porosity, Second Edition, New York: Academic Press, 1982. 2-287.

Hassoun et al., A High-Performance Polymer Tin Sulfur Lithium Ion Battery. Angew. Chem. Int. Ed. 2010, 49, 2371-2374.

(56) References Cited

OTHER PUBLICATIONS

Hayashi et al., All-solid-state rechargeable lithium batteries with Li2S as a positive electrode material. Journal of Power Sources 183 (2008) 422-426.

Hirai et al., Influence of electrolyte on lithium cycling efficiency with pressurized electrode stack. J. Electrochem. Soc. 1994;141:611-14.

Ji et al., A highly ordered nanostructured carbon—sulphur cathode for lithium—sulphur batteries Nature Mater. May 17, 2009;8(6):500-06.

Kim et al., Correlation between positive-electrode morphology and sulfur utilization in lithium—sulfur battery. J Power Sources. May 20, 2004;132(1-2):209-12.

Kulinowski et al., Porous metals from colloidal templates. Adv Mater. 2000;12(11): 833-38.

Kwan, K. S., et al., "Effect of penetrant size, shape, and chemical nature on its transport through a thermoset adhesive. II. Esters," Polymer, 44 (2003) 3071-3083.

Lai et al., Synthesis and Electrochemical Performance of Sulfur/Highly Porous Carbon Composites. J. Phys. Chem. C 2009, 113, 4712-4716.

Lordgooei, M. et al., "New General Pore Size Distribution Model by Classical Thermodynamics Application: Activated carbon", J. of Environmental Engineering, Apr. 2001, 281-287.

Mikhaylik et al., 380 Wh/kg Rechargeable Li/S Batteries Operating at 90% of Sulfur Utilization. 206th Meeting of the Electrochemical Society. Honolulu, Hawaii. Oct. 3-8, 2004. Abst. 443.

Mikhaylik et al., Polysulfide Shuttle Study in the Li/S Battery System. J Electrochem Soc. 2004;151:A1969-76.

Miyahara, M., et al., "Determination of adsorption equilibria in pores by molecular dynamics in a unit cell with imaginary gas phase," J. Chem. Phys., 106 (19), May 15, 1997, 8124-8134.

Peer, Tef_methy_ethyl. Accessed online at peer.tamu.edu/curriculum_modules/properties/module_3/Tef methyl_ethyl.htm. Last accessed May 31, 2013. 1 page.

Probst et al., Structure and electrical properties of carbon black. Carbon. Feb. 2002;40(2):201-5.

Rauh et al., A Lithium/Dissolved Sulfur Battery with an Organic Electrolyte. J Electrochem Soc. 1979;126:523-27.

Ravikrishna et al., Low-temperature synthesis of porous hydroxyapatite scaffolds using polyaphron templates. J Sol-Gel Sci Techn. Apr. 2006;38(2):203-10.

Ronci et al., A novel approach to in situ diffractometry of intercalation materials: the EDXD technique. Preliminary results on LiNi0.8Co0.2O2. Electrochem Solid-State Lett. 2000;3(4):174-7.

Ruiz-Morales et al., Microstructural optimisation of materials for SOFC applications using PMMA microspheres. J Mater Chem. 2006;16:540-42.

Ryu et al., Discharge behavior of lithium/sulfur cell with TEGDME based electrolyte at low temperature. J Electrochem Soc. 2006;163:201-06.

Saito et al., "Improvement in Lithium Cycling Efficiency by Using Additives in Lithium Metal," Journal of Power Sources, 1997, vol. 68, pp. 476-479.

Sakka et al., Fabrication of porous ceramics with controlled pore size by colloidal processing. Sci Technol Adv Mater. Nov. 2005;6(8):915-20.

Shim et al., The Lithium/Sulfur Rechargeable Cell. Effects of Electrode Composition and Solvent on Cell Performance J Electrochem Soc. 2002;149:A1321-25.

Shin et al., Characterization of N-Methyl-N-Butylprrolidinium Bis(trifluoromethanesulfonyl)imide-LiTFSI-Tetra(ethylene gylcol) Dimethyl Ether Mixtures as a Li Metal Cell Electrolyte. J Power Sources. 2008;155:A368-73.

Steele, W.A. et al., "Simulation studies of sorption in model cylindrical micropores," Advances in Colloid and Interface Science, 76-77 (1998) 153-178.

Steele, W.A., "The Physical Adsorption of Gases on Solids", Advances in Colloid and Interface Science, 1 (1967) 3-78.

Takeuchi et al., Preparation of electrochemically active lithium sulfide—carbon composites using spark-plasma-sintering process. Journal of Power Sources 195 (2010) 2928-2934.

Wang et al., Electrochemical characteristics of sulfur composite cathode materials in rechargeable lithium batteries. J Power Sources. Nov. 15, 2004;138(1-2):271-73.

Wang et al., Polymer lithium cells with sulfur composites as cathode materials. Electrochimica Acta 48 (2003) 1861-1867.

Wang et al., Sulfur—carbon nano-composite as cathode for rechargeable lithium battery based on gel electrolyte. Electrochem Comm 2002;4(6):499-502.

Woo et al., Preparation and characterization of three demensionally ordered macroporous Li4Ti5O12 anode for lithium batteries. Electrochimica Acta. 2007;53(1):79-82.

Yuan et al., Improvement of cycle property of sulfur-coated multi-walled carbon nanotubes composite cathode for lithium/sulfur batteries. J Power Sources. Apr. 15, 2009;189(2):1141-46.

Zhang et al., Dual-scale porous electrodes for solid oxide fuel cells from polymer foams. Adv Mater. 2005;17(4):487-91.

Zhang et al., Enhancement of long stability of sulfur cathode by encapsulating sulfur into micropores of carbon spheres. Energy & Environmental Science. 2010, 3, 1531-1537.

Zhang et al., Novel Nanosized Adsorbing Composite Cathode Materials for the Next Generational Lithium Battery. Journal of Wuhan University of Technology-Mater. Sci. Ed. 2007;22(2):234-39.

Zhang et al., Three-dimensional ordered macroporous platinum-based electrode for methanol oxidation. Chinese Sci Bulletin. Jan. 2006;51(1):19-24.

Zheng et al., Electrochemical properties of rechargeable lithium batteries with sulfur-containing composite cathode materials. Electrochem Solid-State Lett., May 12, 2006; 9(7):A364-A367.

Zheng et al., Novel nanosized adsorbing sulfur composite cathode materials for the advanced secondary lithium batteries. Electrochimica Acta. Jan. 5, 2006;51(7):1330-35.

\* cited by examiner

US 9,040,197 B2

ELECTRODE STRUCTURE AND METHOD FOR MAKING THE SAME

RELATED APPLICATIONS

This application is a continuation of U.S. application Ser. No. 13/644,933, filed Oct. 4, 2012, and issed as U.S. Pat. No. 8,936,870 on Jan. 20, 2015, which claims priority to U.S. Provisional Application No. 61/546,685, filed Oct. 13, 2011, which are incorporated herein by reference in their entirety.

STATEMENT REGARDING FEDERALLY SPONSORED RESEARCH AND DEVELOPMENT

This invention was made with government support under Grant No. DE-AR0000067 awarded by the Department of Energy ARPA-E (BEEST DE-FOA-00000207-1536). The government has certain rights in the invention.

FIELD OF INVENTION

The present invention relates to electrode structures, and more specifically, to electrode structures for use in electrochemical cells.

BACKGROUND

A typical electrochemical cell has a cathode and an anode which participate in an electrochemical reaction. Some electrochemical cells (e.g., rechargeable batteries) may undergo a charge/discharge cycle involving stripping and deposition of metal (e.g., lithium metal) on the surface of the anode accompanied by parasitic reactions of the metal on the anode surface with other cell components (e.g., electrolyte components), wherein the metal can diffuse from the anode surface during discharge. The efficiency and uniformity of such processes can affect efficient functioning of the electrochemical cell. In some cases, one or more surfaces of one or more electrodes may become uneven as the electrochemical cell undergoes repeated charge/discharge cycles, often due to uneven redeposition of an ion dissolved in the electrolyte. The roughening of one or more surfaces of one or more electrodes can result in increasingly poor cell performance. Despite the various approaches proposed for forming electrodes and forming interfacial and/or protective layers, improvements are needed.

SUMMARY OF THE INVENTION

The present invention relates to electrode structures, and more specifically, to electrode structures for use in electrochemical cells. Electrochemical cells and other articles including such electrode structures are also provided. The subject matter of the present invention involves, in some cases, interrelated products, alternative solutions to a particular problem, and/or a plurality of different uses of one or more systems and/or articles.

In one set of embodiments, a series of articles are provided. In one embodiment, an article for use in an electrochemical cell is provided. The article comprises an electroactive layer comprising lithium metal and a lithium nitride layer adjacent the electroactive layer, wherein the lithium nitride layer has a thickness of greater than 1 micron and less than 20 microns. The article also includes an electrolyte layer comprising a polymer gel and a lithium salt, wherein the electrolyte layer is adjacent the lithium nitride layer, has a lithium ion conductivity of at least $1\times10^{-4}$ S/cm, and has a yield strength of greater than 50 N/cm$^2$.

In another embodiment, an article for use in an electrochemical cell comprises a composite structure having a first side and a second, opposing side. The composite structure comprises at the first side, a predominantly lithium metal electroactive portion, and at the second side, a predominantly lithium nitride portion. At a location at least 10 microns from the first side toward the second side, the composite structure is free of Li$_3$N or has a molar ratio of Li metal to Li$_3$N of greater than 5:1, and at a location at least 1 micron from the second side toward the first side, the composite structure has a molar ratio of Li metal to Li$_3$N of less than 1:1000 and a lithium ion conductivity of at least $1\times10^{-4}$ S/cm. The composite structure also includes a gradient region comprising both lithium metal and Li$_3$N between the first side and the second side, the gradient region having a thickness of at least 0.005 microns.

In another embodiment, an article for use in an electrochemical cell comprises a composite structure comprising a lithium metal electroactive portion present at a first side of the composite structure, the lithium metal electroactive portion having a thickness of at least 10 microns. The article also includes a lithium nitride portion present at a second side of the composite structure, the lithium nitride portion having a thickness of greater than 1 micron and a lithium ion conductivity of at least $1\times10^{-4}$ S/cm. The article has a gradient region comprising both lithium metal and Li$_3$N between the first side and the second side, the gradient region having a thickness of at least 0.005 microns.

In another embodiment, an article for use in an electrochemical cell comprises an electroactive layer comprising lithium metal, and an electrolyte layer comprising a polymer gel and a lithium salt, wherein the electrolyte layer has a lithium ion conductivity of at least $1\times10^{-4}$ S/cm and a yield strength of greater than 80 N/cm$^2$. The article is under an applied anisotropic force, the anisotropic force having a component normal to a surface of the article, wherein the component defines a pressure of at least 80 N/cm$^2$.

In another set of embodiments, a series of methods is provided. In one embodiment, a method of forming an anode for an electrochemical cell is provided. The method comprises applying a plasma comprising ionized nitrogen to a layer of lithium metal, wherein the layer of lithium metal has a thickness between 1 micron and 50 microns, and reacting the lithium metal with the ionized nitrogen to form a layer of lithium nitride having a thickness of greater than 1 micron.

In another embodiment, a method of forming a lithium metal electrode for using an electrochemical cell is provided. The method comprises providing an article comprising a substrate and a layer of lithium metal adjacent the substrate, wherein the layer of lithium metal has a thickness of at least 10 microns and exposing the layer of lithium metal to a nitrogen gas at a pressure of at least 1 Pa and a temperature between –40° C. and 181° C. The method involves converting at least a portion of the layer of lithium metal to Li$_3$N to form a Li$_3$N protective layer having a thickness of at least 1 micron.

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1:
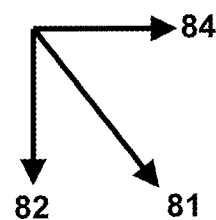
FIG. 1 shows an article for use in an electrochemical cell according to one set of embodiments.
Figure 1:
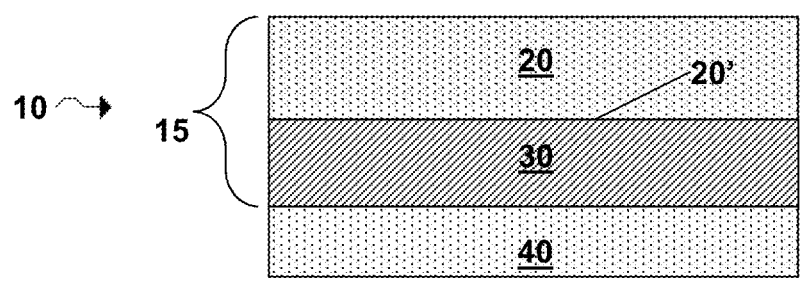

Electrode structures, and more specifically, electrode structures for use in electrochemical cells, are provided. The electrode structures described herein may include one or more protective layers. In one set of embodiments, a protective layer may be formed by exposing a lithium metal surface to a plasma comprising ions of a gas to form a ceramic layer on top of the lithium metal. The ceramic layer may be highly conductive to lithium ions and may protect the underlying lithium metal surface from reaction with components in the electrolyte. In some cases, the ions may be nitrogen ions and a lithium nitride layer may be formed on the lithium metal surface. In other embodiments, the protective layer may be formed by converting lithium to lithium nitride at high pressures. For example, an article comprising a layer of lithium metal on a substrate may be exposed to nitrogen gas at a high pressure, which converts a substantial amount of the lithium metal to lithium nitride. All or portions of the surface may be converted to lithium nitride, optionally with lithium remaining to serve as an electroactive portion. Optionally, after formation of the lithium nitride layer, lithium metal may be inserted between the substrate and the lithium nitride layer (e.g., by a plating process) to form a protected lithium metal electrode. Protective structures in combination with application of force are also provided.

In another set of embodiments, an electrochemical cell including an electrolyte having a relatively high yield strength is provided, in combination with a force applied to the electrochemical cell to impart morphological changes to the electroactive material of an electrode. Advantages of such embodiments are provided in more detail below.

As described herein, in some embodiments, the articles and methods provided can be applied to lithium battery systems, such as lithium metal battery systems. Lithium battery systems generally include a cathode which is electrochemically lithiated during the discharge. In this process, lithium metal is converted to lithium ion and transported through the electrolyte to the battery's cathode where it is reduced. In a lithium/sulfur battery, for example, lithium ion forms one of a variety of lithium sulfur compounds at the cathode. Upon charging, the process is reversed, and lithium metal is plated, from lithium ion in the electrolyte, at the anode. In each discharge cycle, a significant amount (e.g., up to 100%) of available Li may be electrochemically dissolved in the electrolyte, and nearly this amount can be re-plated at the anode upon charge. Typically, slightly less lithium is re-plated at the anode at each charge, as compared to the amount removed during each discharge; a small fraction of the metallic Li anode typically is lost to insoluble electrochemically inactive species during each charge-discharge cycle.

This process is stressful to the anode in many ways, and can lead to premature depletion of Li and reduction of the battery cycle life. During this cycling, the Li anode surface can become roughened (which can increase the rate of field-driven corrosion) and Li surface roughening can increase proportionally to the current density. Many of the inactive reaction products associated with overall Li loss from the anode upon cycling can also accumulate on the increasingly roughened Li surface and may interfere with charge transport to the underlying metallic Li electroactive layer. A rough Li surface is also undesirable since it can increase the surface area available for reaction with components present in the electrolyte, and thereby increase the rate of reaction and reduce the amount of available lithium for cycling. In the absence of other degradation processes in other parts of the battery, the per-cycle Li anode loss alone can eventually render the cell inactive. Accordingly, it is desirable to minimize or inhibit Li-loss reactions, minimize the Li surface roughness/corrosion rate, have evenly-distributed removal of Li during discharge, and prevent any inactive corrosion reaction products from interfering with charge transport across the Li anode surface. Especially at higher current density (which is commercially desirable), these processes can lead to quicker cell death.

As described herein, in some embodiments an article such as an electrode or electrochemical cell includes a protective structure that may be used to separate an electroactive material from an electrolyte to be used with the electrode or electrochemical cell. The separation of an electroactive layer from the electrolyte of an electrochemical cell can be desirable for a variety of reasons, including (e.g., for lithium batteries) the prevention of dendrite formation during recharging, preventing reaction of lithium with the electrolyte or components in the electrolyte (e.g., solvents, salts and cathode discharge products), increasing cycle life, and safety (e.g., preventing thermal runaway). For example, reaction of an electroactive lithium layer with the electrolyte may result in the formation of resistive film barriers on the anode, which can increase the internal resistance of the battery and lower the amount of current capable of being supplied by the battery at the rated voltage. Many different solutions have been proposed for the protection of lithium anodes in such devices, including coating the lithium anode with interfacial or protective layers formed from polymers, ceramics, or glasses, the important characteristic of such interfacial or protective layers being to conduct lithium ions.

While a variety of techniques and components for protection of lithium and other alkali metal anodes are known, these protective coatings present particular challenges, especially in rechargeable batteries. Since lithium batteries function by removal and re-plating of lithium from a lithium anode in each charge/discharge cycle, lithium ions must be able to pass through any protective coating. The coating must also be able to withstand morphological changes as material is removed and re-plated at the anode. The effectiveness of the protective structure in protecting an electroactive layer may also depend, at least in part, on how well the protective structure is integrated with the electroactive layer, the presence of any defects in the structure, and/or the smoothness of the layer(s)

of the protective structure. Many single thin film materials, when deposited on the surface of an electroactive lithium layer, do not have all of the necessary properties of passing Li ions, forcing a substantial amount of the Li surface to participate in current conduction, protecting the metallic Li anode against certain species (e.g., liquid electrolyte and/or polysulfides generated from a sulfur-based cathode) migrating from the cathode, and impeding high current density-induced surface damage.

The inventors of the present application have developed solutions to address the problems described herein through several embodiments of the invention, including, in one set of embodiments, the combination of an electroactive layer, optionally a protective structure, and an electrolyte comprising a polymer gel positioned adjacent the protective structure. The electrolyte may have a yield strength of at least 0.8 times, or greater than, the yield strength of the electroactive layer and a relatively high ion conductivity. Such a structure may optionally be used with a force applied to the electrode during electrode fabrication and/or use. The applied force may be greater than the yield strength of the electroactive material, which causes the electroactive material to yield or deform during cycling, thereby forming a smoother electroactive surface and reducing the surface area available for reaction with components in the electrolyte, compared to the same structure but without the applied force.

In one set of embodiments, solutions to the problems described herein involve the use of a protective structure that is highly conductive to ions and integrally connected with an electroactive material in the form of a composite. The protective layer may have a sufficient thickness to protect the electroactive material from reactive species, which may be present in the electrolyte, yet may have the flexibility to withstand morphological changes as lithium is removed and re-plated at the electrode. Other solutions to the above-noted problems include the use of multi-layered protective structures, which can reduce the number of defects in protective structure and/or impart flexibility to the electrode. Combinations of such embodiments are also described.

In many embodiments described herein, lithium rechargeable electrochemical cells (including lithium anodes) are described. For example, the description provided herein may refer to lithium/sulfur batteries, other lithium metal batteries, or lithium ion batteries. However, wherever lithium electrochemical cells are described herein, it is to be understood that any analogous alkali metal electrochemical cells (including alkali metal anodes) can be used. Additionally, although rechargeable electrochemical cells are primarily disclosed herein, non-rechargeable (primary) electrochemical cells are intended to benefit from the embodiments described herein as well. Furthermore, although the articles and methods described herein are particularly useful in providing anode protection and formation, the articles and methods are also applicable to cathodes.

FIG. 1 shows an example of an article that can be used in an electrochemical cell according to one set of embodiments. As shown in this exemplary embodiment, article 10 includes an anode 15 comprising an electroactive layer 20. The electroactive layer comprises an electroactive material (e.g., lithium metal). In certain embodiments, the electroactive layer may be protected by a protective structure 30, which can include, for example, a single layer or a multi-layered structure as described herein. The protective structure may, in some embodiments, act as an effective barrier to protect the electroactive material from reaction with certain species in the electrolyte. In some embodiments, article 10 includes an electrolyte 40, which may be positioned adjacent the protective structure, e.g., on a side opposite the electroactive layer. The electrolyte can function as a medium for the storage and transport of ions.

In certain embodiments, article 10 is constructed and arranged to be structurally stable during the application of a force to the article. This application of force may enhance the performance of the article during use, as described herein. As shown illustratively in FIG. 1, a force may be applied in the direction of arrow 81. Arrow 82 illustrates the component of the force that is normal to an active surface 20' of the electroactive layer. In the case of a curved surface, for example, a concave surface or a convex surface, the force may comprise an anisotropic force with a component normal to a plane that is tangent to the curved surface at the point at which the force is applied.

Figure 2:
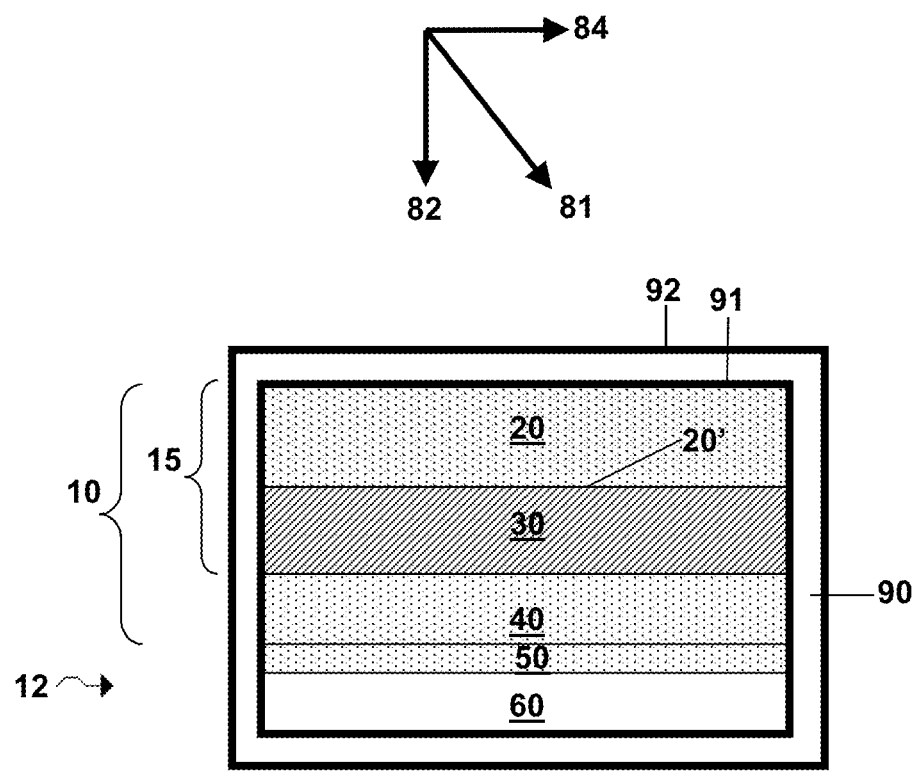
FIG. 2 shows an electrochemical cell according to one set of embodiments.

As shown in the embodiment illustrated in FIG. 2, article 10 may be incorporated with other components to form an electrochemical cell 12. The electrochemical cell may optionally include a separator 50 positioned adjacent or within the electrolyte. The electrochemical cell may further include a cathode 60 comprising a cathode active material.

In one set of embodiments, electroactive layer 20 includes lithium (e.g., lithium metal) and electrolyte layer 40 comprises a polymer gel and a lithium salt. In certain embodiments, the electrolyte layer has a relatively high lithium ion conductivity and a relatively high yield strength. For example, in some embodiments the lithium ion conductivity may be at least $1 \times 10^{-4}$ S/cm, at least $2.5 \times 10^{-4}$ S/cm, at least $5 \times 10^{-4}$ S/cm (or another value described herein) and a yield strength of at least 0.6 times, at least 0.8 times, or greater than, the yield strength of the material forming the electroactive layer. The relatively high lithium ion conductivity of the electrolyte layer allows lithium ions to be transported at a reasonable rate between the anode and cathode during charge and discharge. An article including an electrolyte layer having a particular minimum yield strength may afford certain advantages to the article, especially when the article is under an applied anisotropic force. In some cases, the component of force normal to the surface of the article defines a pressure having a magnitude of at least the magnitude of the yield strength of the electroactive material in the electroactive layer.

The inventors have discovered within the context of the invention that when the electrolyte layer has a relatively high lithium ion conductivity and a relatively high yield strength, and a certain minimum force is applied to the article, this combination causes the electroactive layer to yield or deform during cycling of the cell. For instance, the component of the applied force that is normal to the surface of the article may define a pressure having a magnitude that is greater than the yield strength of the electroactive material, but less than the yield strength of the electrolyte layer, such that the electroactive layer deforms during cycling but the electrolyte layer does not substantially deform during cycling, and maintains its structural integrity. Advantageously, causing the electroactive layer to deform during cycling, but without substantial deformation to the electrolyte layer, can smoothen the surface of the electroactive layer during charge and discharge.

During discharge, lithium metal is oxidized to lithium ion at the anode and during charge, lithium ion is reduced to lithium metal by a replating process. As described above, during this process the lithium anode surface can become roughened, and surface roughening can increase proportionally to the current density. By applying an anisotropic force to the article, in combination with the other components described herein, the electroactive layer may be compressed and the roughening of the electroactive layer may be reduced as a result of the compression. This reduction in roughening can decrease the surface area of the lithium at the anode surface, thereby reducing the available lithium for reaction with a species in the electrolyte.

As known to those of ordinary skill in the art, the yield strength is the stress at which a material exhibits a specified permanent deformation (sometimes referred to as plastic deformation) and is a practical approximation of the elastic limit. Beyond the elastic limit, permanent deformation will occur. As used herein, the yield strength is the lowest stress at which permanent deformation during extension can be measured. One of ordinary skill in the art would be capable of determining the yield strength of a material by, for example, taking a sample with a fixed cross-section area, and pulling it with a controlled, gradually increasing force until the sample changes shape or breaks. Longitudinal and/or transverse strain is recorded using mechanical or optical extensometers. Testing machines for determining the yield strength are commercially available, e.g. from Instron®.

As noted above, the electrolyte layer may be designed such that its yield strength is greater than a particular value. In certain embodiments, the yield strength of the electrolyte layer is at least 0.8 times the yield strength of the electroactive material used with the electrolyte layer, and in some embodiments, greater than the pressure applied to the article (e.g., the normal component of an applied anisotropic force). In some embodiments, the yield strength of the electrolyte layer is greater than 1 times, greater than 1.2 times, greater than 1.5 times, greater than 2 times, greater than 3 times, greater than 4 times, greater than 5 times the yield strength of the electroactive material. In some embodiments, the yield strength of the electrolyte layer is greater than 1 times, greater than 1.2 times, greater than 1.5 times, greater than 2 times, greater than 3 times, greater than 4 times, greater than 5 times the normal component of the pressure that is applied to the article (e.g., during fabrication and/or use). Additional values of yield strength are described in more detail below. Combinations of the above-noted ranges are also possible.

As noted above, the electroactive layer may also be designed to have a relatively high ion conductivity (e.g., lithium ion conductivity). For example, the electrolyte layer may have an ion (e.g., lithium ion) conductivity of at least $1 \times 10^{-4}$ S/cm, at least $2.5 \times 10^{-4}$ S/cm, at least $5 \times 10^{-4}$ S/cm, at least $7.5 \times 10^{-4}$ S/cm, at least $1 \times 10^{-3}$ S/cm, or at least $5 \times 10^{-3}$ S/cm. The lithium ion conductivity of the electrolyte layer may be increased by the addition of a lithium salt or other suitable additive. One of ordinary skill in the art can determine the ionic conductivity of the electrolyte using impedance spectroscopy, e.g., measured at room temperature.

In some embodiments, an electrolyte layer having a relatively high lithium ion conductivity and a relatively high yield strength, as described herein, comprises a polymer gel. Although many polymers are known to have yield strengths greater than the yield strengths of electroactive materials to be used in electrochemical cells (such as a yield strength of greater than 80 N/cm$^2$ for lithium as an electroactive material), the yield strength of a polymer typically decreases when it is in the form of a gel. As known to those of ordinary skill in the art, when a solvent is added to a polymer and the polymer is swollen in the solvent to form a gel, the polymer gel is now more easily deformed (and, thus, has a lower yield strength) than the polymer absent the solvent. The yield strength of a particular polymer gel may depend on a variety of factors such as the chemical composition of the polymer, the molecular weight of the polymer, the degree of crosslinking of the polymer if any, the thickness of the polymer gel layer, the chemical composition of the solvent used to swell the polymer, the amount of solvent in the polymer gel, any additives such as salts added to the polymer gel, the concentration of any such additives, and the presence of any cathode discharge products in the polymer gel.

The inventors have found that a balance is needed between the ion conductivity and the yield strength of the electrolyte layer. Generally, liquid electrolytes have higher ionic conductivities than gel polymer electrolytes or solid electrolytes. As more liquid solvent is added to a polymer to form a polymer gel, the ionic conductivity of the resulting polymer gel may increase since more solvent generally allows a higher amount of salts to be dissolved in the solvent. However, the stiffness and the yield strength of the polymer gel tends to decrease with the addition of more solvent. Similarly, as the amount of solvent in a polymer gel decreases, the ion conductivity of the electrolyte may decrease, while the yield strength of the polymer gel may increase. Thus, it is often difficult to prepare a polymer gel that has both high ion conductivity and high yield strength.

The inventors have discovered within the context of the invention that an electrolyte layer having both the desired yield strength and ionic conductivity may be prepared, in some embodiments, by infiltrating a solid polymer network with a polymer gel. The solid polymer network may give the electrolyte the desired structural support yet may be compliant to add flexibility to the electrochemical cell during cycling. In some embodiments, the pores of the solid polymer network are large enough to not inhibit ionic transport (e.g., by allowing the pores to be infiltrated by an ionically conductive material), yet are small enough to give structural support, e.g., during the application of a force to the electrochemical cell. Other embodiments including an electrolyte layer having both the desired yield strength and ionic conductivity are described in more detail below.

In another set of embodiments, a composite structure for use in an electrochemical cell is provided. The composite structure may include an electroactive portion (e.g., an electroactive layer) comprising an electroactive material present at a first side of the composite structure, and a protective structure present at a second, opposing side of the composite structure. The protective structure is typically configured to be able to conduct ions of the electroactive material across it. In some embodiments, the composite structure also includes a gradient of a material forming all or a portion of the protective structure, the gradient being positioned between the first side and second side of the composite structure. An example of such a configuration is shown in the embodiment illustrated in FIG. 3. Advantages of such a structure will be apparent from the description below.

Figure 3:
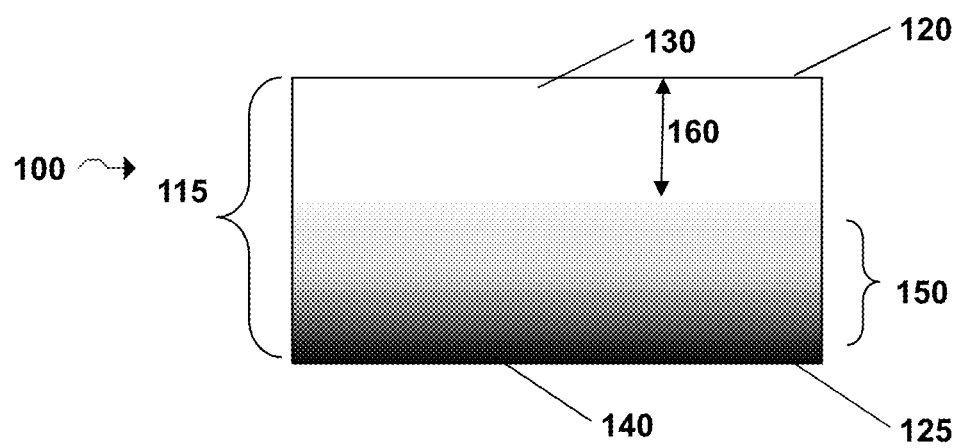
FIG. 3 shows an electrode including an electroactive layer, a protective layer, and a gradient according to one set of embodiments.

As shown illustratively in FIG. 3, article 100 includes a composite structure 115 including a first side 120 and a second side 125. An electroactive portion 130 (e.g., a lithium metal electroactive portion, or a predominately lithium metal electroactive metal portion) may be present at the first side of the composite structure, and a protective structure 140 may be present at the second side of the composite structure. Composite structure 115 may be formed such that protective structure 140 is integrally connected with electroactive portion 130. For example, the structure may be formed such that there is no clear distinction between when the protective structure starts and ends and where the electroactive portion starts and ends (e.g., no distinct, separate electroactive and protective layers). In some cases, integrally connected components have a cohesive/adhesive strength between two materials that is at least as great as the yield strength of each of the materials (e.g., the electroactive material and the material used to form the protective structure).

In some embodiments, protective structure 140 may be a lithium nitride portion or a predominately lithium nitride portion. Although much of the description herein refers to lithium nitride protective structures, it should be appreciated that any suitable material may be used as the protective structure. In some cases, the protective structure is formed of a single-ion conductive material. The single-ion conductive material may be, for example, a ceramic, a glass, or a glassy-ceramic material. Examples of single-ion conductive materials are provided herein. In some cases, the material chosen for the protective structure is suitable for forming a gradient with an electroactive material as described herein. The protective structure may include a single layer, or multiple layers, in some embodiments.

The protective structure may have any suitable composition to prevent or reduce one or more reactions between the electroactive material and a species present in the electrolyte, and to allow conduction of ions across it at a reasonable rate. In some embodiments, the protective structure has a molar ratio of lithium metal to the protective material of less than 1:500 (e.g., less than 1:1000, less than 1:1500, less than 1:2000, less than 1:5000, or less than 1:10000). In some embodiments, such molar ratios are present at a location of at least 0.5 microns, at least 1 micron, at least 2 microns, at least 3 microns, at least 5 microns, at least 7 microns, or at least 10 microns from second side 140 towards first side 130 of the composite structure. Methods for determining material compositions may include water titration and Auger methods as known to those of ordinary skill in the art. The protective structure may also have an ion conductivity (e.g., a lithium ion conductivity) of one of the values described herein (e.g., at least $1 \times 10^{-4}$ S/cm).

The thickness of the protective structure may vary. In some embodiments, the thickness of the protective structure is greater than 0.2 microns, greater than 0.5 microns, greater than 0.75 microns, greater than 1 micron, greater than 1.2 microns, greater than 1.5 microns, greater than 2 microns, greater than 3 microns, greater than 5 microns, greater than 7 microns, or greater than 10 microns. In some embodiments, the thickness of the protective structure is less than or equal to 10 microns, less than or equal to 7 microns, less than or equal to 5 microns, less than or equal to 3 microns, less than or equal to 2 microns, less than or equal to 1 micron, or less than or equal to 0.5 microns. Other values are also possible. Combinations of the above-noted ranges are also possible (e.g., a thickness of greater than 1 micron and less than or equal to 5 microns).

As shown illustratively in FIG. 3, the composite structure may include at least one gradient region 150. The gradient region may comprise both the electroactive material (the same material in electroactive portion 130) and the material used to form protective structure 140 (e.g., lithium nitride). The gradient region may include decreasing amounts of the protective material (e.g., lithium nitride) across the thickness of the structure from side 125 towards side 120.

A composite structure may include any suitable type of gradient. For example, the gradient may be a linear gradient or a curvilinear gradient between the first and second sides of the composite structure. In certain embodiments, a gradient is characterized by a type of function across the thickness of the composite structure. For example, the gradient may be characterized by the shape of a sine function, a quadratic function, a periodic function, an aperiodic function, a continuous function, or a logarithmic function across all or a portion of the structure. Other types of gradients are also possible. The gradient is typically one of different compositions of materials from the first and second sides of the composite structure.

The gradient region may have any suitable thickness. In some embodiments, the gradient region has a thickness of at least 0.005 microns. In certain embodiments, the gradient region has a thickness of, for example, at least 0.01 microns, at least 0.05 microns, at least 0.1 microns, at least 0.5 microns, at least 1 micron, at least 5 microns, or at least 10 microns. In some embodiments, the gradient region has a thickness of less than 10 microns, less than 5 microns, less than 1 micron, less than 0.5 microns, less than 0.1 microns, less than 0.05 microns, or less than 0.01 microns. Other thicknesses are also possible. Combinations of the above-noted ranges are also possible (e.g., a thickness of at least 0.01 microns and less than 5 microns). All or portions of the gradient region may have a ion conductivity (e.g., a lithium ion conductivity) such as one of the values or ranges described herein.

As shown illustratively in FIG. 3, electroactive portion 130 may have a thickness 160. Thickness 160 of the electroactive portion may be, for example, at least 1 micron, at least 5 microns, at least 10 microns, at least 15 microns, at least 20 microns, at least 25 microns, at least 30 microns, at least 40 microns, or at least 50 microns. In some embodiments, the thickness of the electroactive portion is less than or equal to 50 microns, less than or equal to 40 microns, less than or equal to 30 microns, less than or equal to 20 microns, or less than or equal to 10 microns. Other values are also possible. Combinations of the above-noted ranges are also possible.

In some embodiments, the electroactive portion is free of the material used to form the protective structure (e.g., lithium nitride) or has a molar ratio of lithium metal to the protective material (e.g., lithium nitride) of greater than 4:1, greater than 5:1, greater than 6:1, greater than 8:1, greater than 10:1, greater than 15:1, or greater than 20:1. Other values are also possible. In some embodiments, such molar ratios of lithium metal to the protective material is present at a location of at least 2 microns, at least 5 microns, at least 7 microns, at least 10 microns, at least 12 microns, or at least 15 microns from first side 120 toward second side 125.

A composite structure may include any suitable amount of an electroactive portion compared to a gradient portion and protective structure combined. In some cases, for example, an electroactive portion forms at least 50 wt %, at least 60 wt %, at least 70 wt %, at least 80 wt %, at least 90 wt %, at least 95 wt %, at least 99 wt %, at least 99.5 wt %, or at least 99.9 wt % of the composite structure. The remaining portion of the composite structure may be formed of the gradient portion and/or the protective structure. In some cases, less than 99.9 wt %, less than 99.5 wt %, less than 99 wt %, less than 95 wt %, less than 90 wt %, less than 80 wt %, less than 70 wt %, less than 60 wt %, or less that 50 wt % of the composite structure may include the electroactive portion. In some embodiments, the electroactive portion forms between 20 wt %-99 wt %, between 30 wt %-90 wt %, between 40 wt %-90 wt %, between 50 wt %-95 wt %, between 60 wt %-95 wt %, between 60 wt %-99 wt %, or between 70 wt %-99 wt % of the composite structure. Other values and ranges, as well as combinations of the above-referenced values, are also possible.

In some embodiments, the gradient region described herein (e.g., one having a particular thickness and/or ion conductivity) has a certain range of molar ratios of Li metal to $Li_3N$. For example, in some embodiments, any point within the gradient region or a portion of the gradient region may have a molar ratio of Li metal to $Li_3N$ of between 1:1000 and 10:1, between 1:500 and 10:1, between 1:100 and 7:1, between 1:50 and 5:1. It should be understood that the gradient region may have molar ratios of Li metal to $Li_3N$ that are outside of these ranges. For example, the gradient region may comprise a portion having such molar ratios (e.g., and having a thickness of at least 0.005 microns and/or other values described herein), and include other portions that are outside of these ranges.

Article 100 can be prepared alone, or in combination with other components described herein. In some cases, article 100 is used in place of electroactive layer 20 shown in FIG. 1 or 2. In one set of embodiments, composite structure 115 may be used in place of both electroactive layer 20 and protective structure 30 as described herein. For instance, composite structure 115 may include an electrolyte 40 adjacent to second side 125 in one set of embodiments. In other cases, protective structure 30 may be positioned adjacent to second side 125, such that an article includes a first, protective structure 140 and a second, protective structure 30. Other configurations and uses of composite structure 115 are also possible.

In one particular set of embodiments, composite structure 115 may be used in place of electroactive material layer 20 in FIGS. 1 and/or 2, and protective structure 30 may be a thin layer of a polymer applied to the surface of second side 125 of the composite structure. As described in more detail below, a polymer can be used to fill the holes of a single-ion conductive layer, if such holes are present in the layer. In some cases, the polymer is applied such that the holes of the single-ion conductive material are at least partially filled, with addition polymer being deposited as a thin layer on top of the single-ion conductive material. In other embodiments, the polymer is applied to fill all or portions of the holes in a single-ion conductive material layer, e.g., at second side 125, but not enough polymer is deposited to form an identifiable layer of polymer at the surface. The advantages of using a polymer to fill the holes of a single-ion conductive material, if those holes are present, are described in more detail below and in U.S. Pat. No. 7,771,870, filed Apr. 6, 2006, which is incorporated herein by reference in its entirety. A protective structure such as a multi-layered structure can also be used in combination with composite structure 115 in certain embodiments.

Although FIG. 3 shows a gradient portion 150 and an electroactive portion 130, in other embodiments the electroactive portion may not be present or may be present at less than 20 wt %, less than 15 wt %, less than 10 wt %, less than 5 wt %, or less than 2 wt % of the composite structure. Such a structure may be used as an electrode precursor, for example. In some such embodiments, first side 120 may be adjacent a substrate carrier useful for handling the article. To form a protected electrode, an electroactive material may be plated across the composite structure to form an electroactive portion (or a larger electroactive portion if some electroactive material was present in initial composite structure) between the substrate and the protective structure.

As described above, in certain existing electrochemical systems, some of the problems associated with reactivity of the electro active layer (e.g., lithium metal) have been addressed by adding one or more protective layers onto the electroactive layer to prevent direct contact between electroactive layer and species in the electrolyte. Because certain methods for forming the one or more protective layers may involve conditions that cause undesirable reactions with the lithium metal surface during formation of the protective layer, the lithium metal layer may be coated first with a passivating film, such as a temporary protective layer or a plasma treatment layer, and then the protective layer is formed on top of the film. The passivating film is typically a thin layer which has the purpose of acting as a protective layer during fabrication of the anode, but not serving as a protective layer during cycling of the cell. That is, the passivating film was typically thought of as being unsuitable for long term protection of the electroactive layer during cycling of the cell.

The inventors have discovered within the context of aspects of the invention, that the two step process of first forming a thin, passivating film and then forming a protective structure on top of the film, can be replaced by a single step of forming a protective layer on lithium metal without first forming a passivating film in some embodiments. Such a method may be used to form a composite structure described herein, such as the one shown illustratively in FIG. 3. In some embodiments, the method involves applying a plasma of a gas to an electroactive material (e.g., lithium metal) to cause a reaction between an ionized species in the plasma with the electroactive material, and forming a ceramic layer. Advantageously, the ceramic layer may be formed relatively quickly in this process, compared to certain existing methods for forming protective layers. The ceramic layer may act as a protective layer to prevent direct contact between the electroactive material and a species present in an electrolyte in an electrochemical cell.

A plasma may be formed by any suitable process, in the presence of a source of a gas to be ionized (e.g., a nitrogen-containing gas, such as $N_{2(g)}$), and optionally in the presence of a vapor source of electroactive material (e.g., lithium deposition source). In some embodiments, the source(s) may be positioned at or in a vacuum chamber, with a web carrying a substrate at a particular web speed past the source(s).

A method of forming a protective layer may involve, for example, providing a moving substrate and moving the substrate past a source of ionized gas. The source of ionized gas may be characterized by a nozzle through which nitrogen gas is emitted, and components for forming the plasma. Optionally, a source of lithium vapor (e.g., a nozzle through which lithium vapor is emitted) may be included. The method may involve condensing the ionized gas onto the substrate (optionally in the presence of lithium vapor) to form a reaction product onto the substrate, e.g., by reacting the ionized nitrogen with the substrate surface (e.g., an electroactive material surface). This process is referred to herein as a plasma conversion process. The method may optionally include (e.g., simultaneously with the plasma conversion process) reacting the ionized nitrogen with the optional lithium vapor, referred to herein as a plasma deposition process.

During application of a plasma of a gas to an electroactive material surface, a reaction product between an ionized species and the electroactive material may be formed on the surface of the electroactive material. For example, a plasma including ionized nitrogen may be used to react with a lithium surface to form a lithium nitride layer. As the plasma is continuously applied to the surface, the layer of reaction product increases in thickness at the surface, as more energy is applied and more available electroactive material is reacted. Thus, the reaction product may grow from one side of the electroactive material layer into the interior of the electroactive material layer. The reaction product may have the highest concentration at one side of the layer, with decreasing concentrations of the reaction product towards the opposite side of the layer, e.g., in the form of a gradient as described herein.

The method of exposing a surface, such as an electroactive material surface (e.g., a lithium metal surface), to a plasma comprising a reactive gas may allow the formation of a composite structure as described herein. In some embodiments, the resulting composite structure may include both the electroactive material and a reaction product (e.g., a reaction product between the electroactive material and the reactive gas), and the reaction product may be used as a protective layer as described herein. In some such embodiments, the reaction product, as part of the composite structure, has a thickness of greater than 1 micron (e.g., greater than 1.5 microns, greater than 2 microns, greater than 3 microns, greater than 5 microns, or greater than 7 microns).

Certain existing methods used to form a protective layer on top of an electroactive material layer include electron beam evaporation and magnetron sputtering. These methods, however, generally are not used to form a layer of a reaction product having a thickness of greater than 1 micron because the rates of formation are too slow for commercial purposes (e.g., 100-200 slower than certain methods described herein).

As described herein, in certain embodiments, the method of applying a plasma comprising an ionized gas to a layer of an electroactive material (e.g., lithium metal) can take place in the presence of a vapor of the electroactive material (e.g., a lithium vapor). In some such embodiments, in addition to the surface of the electroactive material being converted to a reaction product with the ionized gas, additional reaction product can be formed by the reaction between the electroactive material vapor and ionized gas in the plasma. That is, when the electroactive material vapor and ionized gas in the plasma reach the underlying surface, a reaction product of those materials can be formed (e.g., deposited) at the surface.

Any suitable temperatures and pressures can be used during the plasma conversion and/or deposition process. Typically, the process is performed at a temperature less than the melting temperature of the underlying substrate. In some embodiments, the temperature may be, for example, less than 180° C., less than 150° C., less than 120° C., less than 100° C., less than 80° C., less than 60° C., or less than 40° C. In certain embodiments, the temperature may be greater than 40° C., greater than 60° C., greater than 80° C., greater than 100° C., greater than 120° C., or greater than 150° C. Other temperatures are also possible. Combinations of the above-noted ranges are also possible.

In some embodiments, the plasma conversion and/or deposition process occurs under vacuum, although methods involving plasmas at atmospheric pressure are also possible. In some embodiments, the process occurs at a pressure that is less than 10 torr, less than 5 torr, less than 1 torr, less than 0.5 torr, less than 0.1 torr, less than 0.05 torr, less than 0.01 torr, or less than 0.005 torr. In certain embodiments, the pressure is greater than $10^{-6}$ torr, greater than $10^{-5}$ torr, greater than $10^{-4}$ torr, or greater than $10^{-3}$ torr. Other pressures are also possible. Combinations of the above-noted ranges are also possible.

In another set of embodiments, a method for forming a protective layer involves providing an article comprising a substrate and a layer of electroactive material (e.g., lithium metal) adjacent to the substrate. The method includes exposing the layer of electroactive material to a gas under suitable conditions to react with the electroactive material at the surface of the electroactive material layer. In one set of embodiments, a plasma is not used in such a process. In some embodiments, a vacuum is not used in such a process. All or a portion of the layer of electroactive material may be converted to a protective layer by this method. For example, the electroactive material may be lithium metal and the gas may be nitrogen gas, and under suitable temperatures and pressures, a lithium nitride layer may be formed at the surface of the lithium metal. In some cases, the protective layer (e.g., the lithium nitride layer) may have a thickness of, for example, at least 0.2 microns, at least 0.5 microns, at least 1 micron, at least 1.5 microns, at least 2 microns, at least 3 microns, at least 5 microns, or at least 10 microns. Other thicknesses are also possible.

The formation of the protective layer may occur at any suitable temperature and pressure. In some cases, the method (e.g., a process of converting an electroactive material to a protective layer such as a ceramic) may be performed at a pressure of, for example, at least 1 Pa, at least 10 Pa, at least 100 Pa, at least 0.001 Pa, least 0.01 MPa, at least 0.05 MPa, at least 1 MPa, at least 5 MPa, at least 10 MPa, at least 15 MPa, or at least 20 MPa. In certain embodiments, the method may be performed at a pressure of less than 0.01 MPa, less than 0.05 MPa, less than 1 MPa, less than 5 MPa, less than 10 MPa, less than 15 MPa, or less than 20 MPa. Other pressures are also possible. Combinations of the above-noted ranges are also possible.

The temperature during formation of a protective layer may, in some embodiments, be between −40° C. and 181° C. In some cases, the temperature may be greater than −40° C., greater than −20° C., greater than 0° C., greater than 20° C., greater than 40° C., greater than 60° C., greater than 80° C., greater than 100° C., greater than 120° C., greater than 140° C., or greater than 160° C. In certain embodiments, the temperature is less than 180° C., less than 160° C., less than 140° C., less than 120° C., less than 100° C., less than 80° C., less than 60° C., less than 40° C., less than 20° C., less than 0° C., or less than −20° C. Other temperatures are also possible. Combinations of the above-noted ranges are also possible.

In some embodiments, the methods described herein can allow formation of a reaction product at a surface (in which the reaction product acts as a protective layer as described herein) at a particular average rate. For example, the formation of a protective layer (e.g., having a thickness of at least 1 micron, at least 1.5 microns, at least 2 microns, at least 3 microns, at least 5 microns, or at least 7 microns) may occur at an average rate of greater than 1 micron/10 hrs, greater than 1 micron/5 hrs, greater than 1 micron/3 hrs, greater than 1 micron/2 hrs, greater than 1 micron/1 hr, greater than 1 micron/30 mins, greater than 1 micron/15 mins, greater than 1 micron/10 mins, greater than 1 micron/5 mins, or greater than 1 micron/2 mins. In some embodiments, the rate may be less than 1 micron/min, less than 1 micron/2 mins, or less than 1 micron/10 mins. Other rates are also possible. Combinations of the above-noted ranges are also possible.

The rate of formation of a reaction product may depend, in some embodiments, on the web speed of an underlying wire or web used to carry the article or substrate (e.g., for certain plasma deposition processes). The web speed for forming a protective layer having a thickness of at least 1 micron (e.g., at least 1.5 microns, at least 2 microns, at least 3 microns, at least 5 microns, or at least 7 microns) may be, for example, greater than 0.1 m/min, greater than 0.5 m/min, greater than 1 m/min, greater than 5 m/min, greater than 7 m/min, greater than 10 m/min, greater than 12 m/min, greater than 15 m/min, or greater than 20 m/min. In some cases, the web speed has a rate of less than 50 m/min, less than 30 m/min, less than 20 m/min, less than 15 m/min, less than 10 m/min, or less than 5 m/min. Other rates are also possible. Combinations of the above-noted ranges are also possible.

In a conversion process described herein, all or portions of the electroactive layer may be converted to a protective layer. For example, in some cases at least 1 wt %, at least 5 wt %, at least 10 wt %, at least 15 wt %, at least 20 wt %, at least 30 wt %, at least 40 wt %, at least 50 wt %, at least 60 wt %, at least 70 wt %, at least 80 wt %, at least 90 wt %, at least 95 wt %, or 100 wt % of the electroactive layer may be converted to a protective material (e.g., based on the weight of the electroactive layer prior to conversion). In some cases less than 100 wt %, less than 95 wt %, less than 90 wt %, less than 80 wt %, less than 70 wt %, less than 60 wt %, less than 50 wt %, less than 40 wt %, less than 30 wt %, less than 20 wt %, less than 15 wt %, less than 10 wt %, less than 5 wt %, or less than 1 wt % of the initial electroactive layer may be converted to a protective material. Combinations of the above-noted ranges are also possible.

In some embodiments in which all or substantially all of the electroactive material is converted to a protective material, an article including a substrate and a protective material may be formed. To form an electrode including an electroactive material, an electroactive material may be deposited between the substrate and the protective layer in a subsequent, optional process. In certain embodiments, a plating process may be used to form a layer of electroactive material between the substrate and the protective layer. In one particular set of embodiments, a plating process may be used to increase the thickness of an electroactive layer already present between the substrate and the protective layer. Processes for plating an electroactive material across a protective layer are described in more detail in U.S. Application No. 61/498,339, filed on Jun. 17, 2011, entitled "Plating Technique for Electrode", which is incorporated herein by reference in its entirety.

The various components associated with FIGS. 1-3 will now be described in more detail. It should be understood that not all components shown in FIGS. 1-3 need be present in the articles described herein. Furthermore, articles such as electrochemical cells and precursors to electrochemical cells may include additional components that are not shown in FIGS. 1-3. Articles may also include other configurations and arrangements of components besides those shown in FIGS. 1-3.

In some embodiments, a force, or forces, applied to portions of an electrochemical cell as described in this application may reduce irregularity or roughening of an electrode surface of the cell, improving performance. The force may comprise, in some instances, an anisotropic force with a component normal to an active surface of the anode of the electrochemical cell. In the embodiments described herein, electrochemical cells (e.g., rechargeable batteries) may undergo a charge/discharge cycle involving deposition of metal (e.g., lithium metal or other active material as described below) on a surface of the anode upon charging and reaction of the metal on the anode surface, wherein the metal diffuses from the anode surface, upon discharging. The uniformity with which the metal is deposited on the anode may affect cell performance. For example, when lithium metal is removed from and/or redeposited on an anode, it may, in some cases, result in an uneven surface, for example, upon redeposition it may deposit unevenly forming a rough surface. The roughened surface may increase the amount of lithium metal available for undesired chemical reactions which may result in decreased cycling lifetime and/or poor cell performance. The application of force to the electrochemical cell has been found, in accordance with embodiments described herein, to reduce such behavior and to improve the cycling lifetime and/or performance of the cell.

As shown illustratively in FIGS. 1 and 2, in some embodiments, an anisotropic force having a component normal to the surface of the article is applied to the article during formation and/or use of the article. For example, a force may be applied in the direction of arrow 81, wherein arrow 82 illustrates the component of the force that is normal to a surface 20' of article 10 in FIG. 1, or of electrochemical cell 12 shown in FIG. 2. In the case of a curved surface, for example, a concave surface or a convex surface, the force may comprise an anisotropic force with a component normal to a plane that is tangent to the curved surface at the point at which the force is applied.

In some embodiments, an anisotropic force with a component normal to a surface of the electrode or electrochemical cell is applied during at least one period of time during formation of an electrode. In certain embodiments, an anisotropic force with a component normal to a surface of the electrode or electrochemical cell is applied during at least one period of time during charge (and/or discharge). In yet other embodiments, an anisotropic force with a component normal to a surface of the electrode or electrochemical cell is applied during at least one period of time during use of the electrochemical cell (e.g., during charge and/or discharge). In some embodiments, the force may be applied continuously, over one period of time, or over multiple periods of time that may vary in duration and/or frequency. The anisotropic force may be applied, in some cases, at one or more pre-determined locations, optionally distributed over the entire surface (or at least 50%, 60%, 70%, 80%, 90%, or 95% of the surface area) of the component. In some cases, the anisotropic force can be applied to 100% of the surface area of the component. In some embodiments, the anisotropic force is applied uniformly over the surface of the component.

An "anisotropic force" is given its ordinary meaning in the art and means a force that is not equal in all directions. A force equal in all directions is, for example, internal pressure of a fluid or material within the fluid or material, such as internal gas pressure of an object. Examples of forces not equal in all directions include forces directed in a particular direction, such as the force on a table applied by an object on the table via gravity. Another example of an anisotropic force includes a force applied by a band arranged around a perimeter of an object. For example, a rubber band or turnbuckle can apply forces around a perimeter of an object around which it is wrapped. However, the band may not apply any direct force on any part of the exterior surface of the object not in contact with the band. In addition, when the band is expanded along a first axis to a greater extent than a second axis, the band can apply a larger force in the direction parallel to the first axis than the force applied parallel to the second axis.

A force with a "component normal" to a surface, for example an active surface of an anode, is given its ordinary meaning as would be understood by those of ordinary skill in the art and includes, for example, a force which at least in part exerts itself in a direction substantially perpendicular to the surface. Those of ordinary skill can understand other examples of these terms, especially as applied within the description of this document.

In some embodiments, the anisotropic force can be applied such that the magnitude of the force is substantially equal in all directions within a plane defining a cross-section of the electrochemical cell, but the magnitude of the forces in out-of-plane directions is substantially unequal to the magnitudes of the in-plane forces.

In one set of embodiments, cells described herein are constructed and arranged to apply, during at least one period of time during charge and/or discharge of the cell, an anisotropic force with a component normal to the active surface of the anode. Those of ordinary skill in the art will understand the meaning of this. In such an arrangement, the cell may be formed as part of a container which applies such a force by virtue of a "load" applied during or after assembly of the cell, or applied during use of the cell as a result of expansion and/or contraction of one or more portions of the cell itself.

The magnitude of the applied force is, in some embodiments, large enough to enhance the performance of the electrochemical cell. An anode active surface, the anisotropic force (optionally with other components described herein such as an electrolyte comprising a polymer gel and/or a protective layer) may be, in some instances, together selected such that the anisotropic force affects surface morphology of the anode active surface to inhibit increase in anode active surface area through charge and discharge and wherein, in the absence of the anisotropic force but under otherwise essentially identical conditions, the anode active surface area is increased to a greater extent through charge and discharge cycles. "Essentially identical conditions," in this context, means conditions that are similar or identical other than the application and/or magnitude of the force. For example, otherwise identical conditions may mean a cell that is identical, but where it is not constructed (e.g., by brackets or other connections) to apply the anisotropic force on the subject cell.

The magnitude of the anisotropic force may be selected based, at least in part, on the material composition of the electroactive layer formed or to be formed (e.g., since the force may also be applied to the electroactive layer during and after formation of the layer), the yield strength of the electroactive material, and/or the yield strength of the electrolyte layer to be used in the electrochemical cell. For example, where the surface of the electroactive layer (and/or electrolyte layer) is relatively softer, the component of the force normal to the surface of the electroactive layer may be selected to be lower. Where the surface of the electroactive layer (and/or electrolyte layer) is harder, the component of the force normal to the active surface may be greater. Those of ordinary skill in the art can easily select anode materials, alloys, mixtures, etc. with known or predictable properties, or readily test the hardness or softness of such surfaces, and readily select cell construction techniques and arrangements to provide appropriate forces to achieve what is described herein. Simple testing can be done, for example by arranging a series of active materials, each with a series of forces applied normal (or with a component normal) to the surface of the electroactive layer, to determine the morphological effect of the force on the surface without cell cycling (for prediction of the selected combination during cell cycling) or with cell cycling with observation of a result relevant to the selection.

The component of the anisotropic force normal to a surface of the electrode or electrochemical cell may define a pressure of between, for example, 2 to 200 Newtons per square centimeter, $N/cm^2$ (e.g., between 2 and 100 $N/cm^2$, between 10 and 100 $N/cm^2$, between 20 and 150 $N/cm^2$, between 49 and 117.6 $N/cm^2$, between 68.6 and 98 $N/cm^2$, between 50 to 150 $N/cm^2$, or between 50 to 100 $N/cm^2$). In some embodiments, the component of the anisotropic force normal to a surface of the electrode or electrochemical cell may, for example, define a pressure of at least 4.9, at least 5, at least 9.8, at least 10, at least 14.7, at least 15, at least 19.6, at least 20, at least 24.5, at least 25, at least 29.4, at least 30, at least 34.3, at least at least 39, at least 40, at least 45, at least 49, at least 50, at least 60, at least 70, at least 75, at least 78, at least 85, at least 98, at least 100, at least 105, at least 110, at least 115, at least 117.6, at least 120, at least 125, at least 130, at least 135, at least 140, at least 145, or at least 147, at least 150, at least 155, at least 160, at least 170, at least 180, at least 190, or at least 200 $N/cm^2$. In some embodiments, the component of the anisotropic force normal a surface of the electrode or electrochemical cell may, for example, define a pressure of less than 200, less than 196, less than 180, less than 170, less than 160, less than 150, less than 147, less than 140, less than 130, less than 120, less than 117.6, less than 100, less than 98, less than 90, less than 80, less than 70, less than 60, less than 50, less than 49, less than 25, less than 24.5, less than 10, or less than 9.8 $N/cm^2$. Other ranges, and combinations of the above-noted ranges are also possible (e.g., a pressure of at least 50 and less than 100 $N/cm^2$).

In some embodiments, the component of the anisotropic force normal to a surface of the electrode or electrochemical cell may define a pressure that is at least 0.5 times, at least 0.7 times, at least 1.0 times, 1.25 times, at least 1.5 times, at least 1.75 times, at least 2.0 times, at least 2.5 times, or at least 3.0 times the yield strength of the anode active material (e.g., lithium). Such magnitudes can be easily calculated since yield strength is an inherent property of a material.

As described herein, in some embodiments the force applied to the article may be commensurate with the yield strength of an electrolyte layer (e.g., a polymer gel) used with the electrochemical cell. In some embodiments, the yield strength of the electrolyte layer is greater than the pressure that is applied to the article (e.g., the normal component of the pressure applied to the article) such that the electrolyte layer does not substantially deform under the applied pressure. In certain embodiments, the yield strength of the electrolyte layer may be greater than 1 times, greater than 1.2 times, greater than 1.5 times, greater than 1.7 times, greater than 2 times, greater than 2.5 times, greater than 3 times, greater than 4 times, greater than 5 times, greater than 7 times, or greater than 10 times the pressure that would be applied to the article (e.g., the normal component of the pressure applied to the article). In certain embodiments, the yield strength of the electrolyte layer is less than 500 times, less than 200 times, less than 100 times, less than 75 times, less than 50 times, less than 30 times, less than 20 times, less than 10 times, or less than 5 times the pressure that would be applied to the article (e.g., the normal component of the pressure applied to the article). Combinations of the above-noted ranges are also possible.

While forces and pressures are generally described herein in units of Newtons and Newtons per unit area, respectively, forces and pressures can also be expressed in units of kilograms-force and kilograms-force per unit area, respectively. One or ordinary skill in the art will be familiar with kilogram-force-based units, and will understand that 1 kilogram-force is equivalent to about 9.8 Newtons.

In some cases, one or more forces applied to the cell have a component that is not normal to an active surface of an anode. For example, in FIG. 1, force 84 is not normal to anode active surface 20'. In one set of embodiments, the sum of the components of all applied anisotropic forces in a direction normal to the anode active surface is larger than any sum of components in a direction that is non-normal to the anode active surface. In some embodiments, the sum of the components of all applied anisotropic forces in a direction normal to the anode active surface is at least about 5%, at least about 10%, at least about 20%, at least about 35%, at least about 50%, at least about 75%, at least about 90%, at least about 95%, at least about 99%, or at least about 99.9% larger than any sum of components in a direction that is parallel to the anode active surface.

In some embodiments, the cathode and anode have yield stresses, wherein the effective yield stress of one of the cathode and anode is greater than the yield stress of the other, such that an anisotropic force applied normal to the surface of one of the active surface of the anode and the active surface of the cathode causes the surface morphology of one of the cathode and the anode to be affected. In some embodiments, the component of the anisotropic force normal to the anode active surface is between about 20% and about 200% of the yield stress of the anode material, between about 50% and about 120% of the yield stress of the anode material, between about 80% and about 120% of the yield stress of the anode material, between about 80% and about 100% of the yield stress of the anode material, between about 100% and about 300% of the yield stress of the anode material, between about 100% and about 200% of the yield stress of the anode material, or between about 100% and about 120% of the yield stress of the anode material.

The anisotropic force described herein may be applied using any suitable method known in the art. In some embodiments, the force may be applied using compression springs. For example, referring to FIG. 2, electrochemical cell 12 may be situated in an optional enclosed containment structure 90 with one or more compression springs situated between surface 91 and the adjacent wall of the containment structure to produce a force with a component in the direction of arrow 82. In some embodiments, the force may be applied by situating one or more compression springs outside the containment structure such that the spring is located between an outside surface 92 of the containment structure and another surface (e.g., a tabletop, the inside surface of another containment structure, an adjacent cell, etc.). Forces may be applied using other elements (either inside or outside a containment structure) including, but not limited to, Belleville washers, machine screws, pneumatic devices, and/or weights, among others.

In some cases, cells may be pre-compressed before they are inserted into containment structures, and, upon being inserted to the containment structure, they may expand to produce a net force on the cell. Such an arrangement may be advantageous, for example, if the cell is capable of withstanding relatively high variations in pressure. In such embodiments, the containment structures may comprise a relatively high strength (e.g., at least about 100 MPa, at least about 200 MPa, at least about 500 MPa, or at least about 1 GPa). In addition, the containment structure may comprise a relatively high elastic modulus (e.g., at least about 10 GPa, at least about 25 GPa, at least about 50 GPa, or at least about 100 GPa). The containment structure may comprise, for example, aluminum, titanium, or any other suitable material.

In some cases, any of the forces described herein may be applied to a plurality of electrochemical cells in a stack. As used herein, a "stack" of electrochemical cells is used to refer to a configuration in which multiple cells are arranged in an essentially cell-repetitive pattern, e.g., positioned on top of one another. In some cases, the cells may be positioned such that at least one surface of each cell in the stack is substantially parallel to at least one surface of every other cell in the stack, e.g., where a surface of one particular component (e.g., the anode) of one cell is substantially parallel to the same surface of the same component of every other cell. In some embodiments, the cells may be in direct contact with one another, while in some instances one or more spacers may be positioned between the cells in a stack. The stack of electrochemical cells may comprise any suitable number of cells (e.g., at least 2, at least 3, at least 5, at least 10, at least 25, at least 100 cells, or more).

In some embodiments, a constricting element may surround at least a portion of an article or a stack of articles. The constricting element may be constructed and arranged, in some cases, to apply an anisotropic force with a component normal to at least one surface within the article or stack of articles defining a pressure having a magnitude described herein.

In some embodiments, the constricting element may comprise a band (e.g., an elastic band, a turnbuckle band, etc.). In some embodiments, a band can be affixed to an article or stack by, for example adhesive, staples, clamps, a turn-buckle, or any other suitable method. In some cases, the band comprises a turnbuckle band (e.g., a Kevlar turnbuckle band), and force is applied by tightening the band and securing the turnbuckle. In some instances, the band is a continuous elastic band. In some cases, after the elastic band is stretched and positioned around the article(s), a force may be applied via the elastic constriction of the band. As a specific example, a band can be installed by cooling the band material below its martensitic transformation temperature and plastically deforming (e.g., via stretching) the band to fit over the article or stack of articles. Upon returning to operating temperature, the band could then shrink to its pre-formed shape, by which the band could apply a force.

The constricting element may comprise any suitable material with an amount of elasticity necessary to produce the desired force. A solid band of elastic material can be sized such that it provides required external pressure upon being applied to the outer surface of the article(s). In some cases, the constricting element may comprise a polymeric material. The constricting element may comprise, for example, Desmopan® 392 (a polyester urethane, made by Bayer MaterialScience, Leverkusen, Germany), Estane® (an engineered polymer made by The Lubrizol Corporation, Wickliffe, Ohio), Kevlar® (a synthetic fiber made by DuPont, Wilmington, Del.), among others. In some embodiments, the constricting element may comprise a shape memory alloy (e.g., nitinol (NiTi)), which may expand and contract upon varying the temperature to which the material is exposed. In some cases, the constricting element can comprise shrink wrap tubing such as, for example, polyester film and/or fabric.

In some embodiments, the mass density of the elements (e.g., a constricting element, an expanding element, etc.) used to apply a force to an article or stack of articles is relatively low. By using elements with relatively low mass densities, the energy density and specific energy of the article or stack of articles may remain relatively high. In some embodiments the mass density of the element(s) used to apply a force to an article or a stack of articles is less than 10 $g/cm^3$, less than 5 $g/cm^3$, less than 3 $g/cm^3$, less than 1 $g/cm^3$, less than 0.5 $g/cm^3$, less than 0.1 $g/cm^3$, between 0.1 $g/cm^3$ and 10 $g/cm^3$, between 0.1 $g/cm^3$ and 5 $g/cm^3$, or between 0.1 $g/cm^3$ and 3 $g/cm^3$.

In some embodiments, pressure distribution components may be included between an article and another article or between an article and a constricting element. Such pressure distribution components can allow for a uniform force to be applied throughout the article or stack of articles. Examples of pressure distribution components include end caps and spacers. These and other components involved in applying a force to an article or a stack of articles are described in more detail in U.S. patent application Ser. No. 12/535,328, filed Aug. 4, 2009, published as U.S. Pub. No. 2010/0035128, and entitled "Application of Force In Electrochemical Cells".

Pressure distribution components and constriction elements are not limited to flat cell geometries, and in some instances, they may be used to apply a force to a cylindrical article (e.g., electrochemical cell), a prismatic article (e.g., a triangular prism, a rectangular prism, etc.), or articles of other shapes. For example, in some embodiments, one or more wraps of the same or different winding material may be positioned on the outside surface of the article. In some embodiments, the winding material comprises relatively high strength. The winding material may also comprise a relatively high elastic modulus. In some cases, shrink wrap tubing such as polyester film and fabric. In some cases, the constriction element comprises an elastic material properly sized to provide required external pressure after it relaxes on the outer surface of the article.

In some embodiments, the article may comprise an expanding element (e.g., an expanding mandrel) within an inner volume of the article such that the expanding element apply a force radiating outward from the inner volume of the article. In some embodiments, the expanding element and the constricting element can be constructed and arranged such that the force within the boundaries of the article deviates by less than 30%, less than 20%, less than 10%, or less than 5% of the median force within the boundaries of the article. In some embodiments, such a distribution of forces can be achieved, for example, by selecting constricting and expanding elements such that substantially equal internal and external forces per unit area are applied to the article.

In some embodiments, rather than applying internal pressure, external pressure application can be combined with complimentary winding mechanics to achieve a radial pressure distribution that is within acceptable bounds. For example, proper surface nip winding (e.g., using a nip roller) can produce a radial pressure distribution varying from 107.9 $N/cm^2$ at the inner diameter to 0 $N/cm^2$ at the outer diameter of the cell. The contracting element may be constructed and arranged to produce a force of 0 $N/cm^2$ at the inner diameter and 78.5 $N/cm^2$ at the outer diameter. The superposition of these two distributions can result in a mean pressure application of 98 $N/cm^2$ with a variation of ±19.6 $N/cm^2$.

In some embodiments, the total volumes of the pressure distribution elements(s) (e.g., end caps, spacers, etc.) and the element(s) used to apply a force to the cell or stack of cells (e.g., bands, mandrels, etc.) may be relatively low. By employing low volumes, the energy density of the assembly may be kept relatively high. In some cases, the sum of the volumes of the pressure distribution element(s) and the element(s) used to apply a force to an article or stack of articles comprises less than 10%, less than 5%, less than 2%, less than 1%, less than 0.5%, less than 0.1%, between 0.1% and 10%, between 0.1% and 5%, between 0.1% and 2%, or between 0.1% and 1% of the volume of the article or stack of articles.

In some cases, the articles described herein may change size (e.g., swell) during charge and discharge, or during formation of the article (e.g., a layer within the article). When selecting the method of applying the anisotropic force, it may be desirable, in some embodiments, to select methods that produce a relatively constant force as the article changes shape and/or size during charge and discharge, or during formation. In some instances, this selection may be analogous to selecting a system with a low effective spring constant (e.g., a "soft" spring). For example, when using a compression spring to apply the anisotropic force, a spring with a relatively low spring constant may produce an anisotropic force that is more constant during charge/discharge than the force produced by a spring with a relatively high spring constant. In cases where elastic bands are used, a band with a relatively high elasticity may produce an anisotropic force that is more constant during charge/discharge than the force produced by a band with a relatively low elasticity. In some embodiments in which force is applied using a machine screw, the use of soft screws (e.g., brass, polymer, etc.) may be advantageous. In some applications, for example, a machine screw may be selected to cover a desired range of compression, but the screw itself may be soft.

In some embodiments, the articles described herein are placed in containment structures, and at least a portion of an anisotropic force with a component normal to a surface of the article is produced due to the expansion of the article relative to the containment structure. In some cases, the containment structure is sufficiently rigid such that it does not deform during the expansion of the article, resulting in a force applied on the article. The article may swell as the result of a variety of phenomena. For example, in some cases, the article may undergo thermal expansion. In some embodiments, the article may swell due to charge and/or discharge. For example, in some cases, a partially or fully discharged cell may be placed in a containment structure. Upon charging the discharged cell, the cell may swell. In other embodiments, expansion may take place due to the formation of a layer (e.g., an electroactive layer) within the article. Expansion in these scenarios may be limited by the dimensions of the containment structure, resulting in the application of an anisotropic force.

In some cases, the article may swell due to the adsorption of a liquid into porous components of the article. For example, in some embodiments, an article including a dry porous layer may be placed within a containment structure. The dry porous layer may then be soaked (e.g., with a liquid electrolyte). In some cases, the properties of the electrolyte (e.g., surface tension) and the article (e.g., size of the porous cavities) may be selected such that, when the article is wetted by the electrolyte, a desirable level of capillary pressure is generated. Once wetted, the article may swell, thus generating an anisotropic force. At equilibrium, the anisotropic force exerted by the containment structure on the article will be equal to the force resulting from the capillary pressure.

Containment structures described herein may comprise a variety of shapes including, but not limited to, cylinders, prisms (e.g., triangular prisms, rectangular prisms, etc.), cubes, or any other shape. In some embodiments, the shape of the containment structure is chosen such that the walls of the containment structure are parallel to the outer surfaces of the article. For example, in some cases, the containment structure may comprise a cylinder, which can be used, for example, to surround and contain a cylindrical electrolytic cell. In other instances, the containment structure may comprise a prism surrounding a similarly shaped prismatic electrolytic cell.

In some embodiments, aspects of the invention relate to the discovery that the application of a force as described herein may allow for the use of smaller amounts of anode active material (e.g., lithium) and/or electrolyte within an electrode or an electrochemical cell, relative to the amounts used in essentially identical electrodes or cells in which the force is not applied. In cells lacking the applied force described herein, anode active material (e.g., lithium metal) may be, in some cases, redeposited unevenly on an anode during charge-discharge cycles of the cell, forming a rough surface (e.g., a "mossy" morphology). In some cases, this may lead to an increase in the rates of one or more undesired reactions involving the anode metal. These undesired reactions may, after a number of charge-discharge cycles, stabilize and/or begin to self-inhibit such that substantially no additional anode active material becomes depleted and the cell may function with the remaining active materials. For cells lacking the applied force as described herein, this "stabilization" is often reached only after a substantial amount of anode active material has been consumed and cell performance has deteriorated. Therefore, in some cases where forces as described herein have not been applied, a relatively large amount of anode active material and/or electrolyte has often been incorporated within cells to accommodate for loss of material during consumption of active materials, in order to preserve cell performance.

Accordingly, the application of force as described herein may reduce and/or prevent depletion of active materials such that the inclusion of large amounts of anode active material and/or electrolyte within the electrochemical cell may not be necessary. The application of force may, for instance, suppress the development of a "mossy" surface. For example, the force may be applied to a cell prior to use of the cell, or in an early stage in the lifetime of the cell (e.g., less than 15, 10, or 5 charge-discharge cycles), such that little or substantially no depletion of active material may occur upon charging or discharging of the cell. By reducing and/or eliminating the need to accommodate for active material loss during charge-discharge of the cell, relatively small amounts of anode active material may be used to fabricate electrodes, cells and devices as described herein. In some embodiments, the invention relates to devices comprising an electrochemical cell having been charged and discharged less than 15, 10, or 5 times in its lifetime, wherein the cell comprises an anode, a cathode, and an electrolyte, wherein the anode comprises no more than 5 times the amount of anode active material which can be ionized during one full discharge cycle of the cell. In some cases, the anode comprises no more than 4, 3, 2, or 1.5 times the amount of lithium which can be ionized during one full discharge cycle of the cell.

A variety of materials and arrangements can be used in individual assemblies described and illustrated herein, or in all of the assemblies. It is to be understood that where a particular component or arrangement is described in connection with one embodiment or figure, that component or arrangement can be used in connection with any others.

Additional arrangements, components, and advantages of applying one or more forces to an electrochemical described herein are provided in U.S. patent application Ser. No. 12/535,328, filed Aug. 4, 2009, entitled "Application of Force In Electrochemical Cells", published as U.S. Pub. No. 2010/0035128, which is incorporated herein by reference in its entirety.

In one set of embodiments, an article described herein includes an anode comprising lithium and a multi-layered structure positioned between the anode and an electrolyte of the cell. The multi-layered structure may serve as a protective layer as described herein. In some embodiments, the multi-layered structure may include at least a first single-ion conductive material layer and at least a first polymeric layer positioned adjacent the single-ion conductive material. In this embodiment, the multi-layered structure can optionally include several sets of alternating single-ion conductive material layers and polymeric layers. The multi-layered structures can allow passage of lithium ions, while limiting passage of certain chemical species that may adversely affect the anode (e.g., species in the electrolyte). This arrangement can provide significant advantage, as polymers can be selected that impart flexibility to the system where it can be needed most, namely, at the surface of the electrode where morphological changes occur upon charge and discharge.

In some embodiments, the single-ion conductive material is non-polymeric. In certain embodiments, the single-ion conductive material is defined in part or in whole by a layer that is highly conductive toward lithium and minimally conductive toward electrons. In other words, the single-ion conductive material may be one selected to allow lithium ions, but to impede electrons, from passing across the layer. In other embodiments, the single-ion conductive material may be substantially conductive to electrons.

In one set of embodiments, the single-ion conductive layer is a ceramic layer, a glassy layer, or a glassy-ceramic layer, e.g., a single ion conducting glass conductive to lithium ions. Suitable glasses and/or ceramics include, but are not limited to, those that may be characterized as containing a "modifier" portion and a "network" portion, as known in the art. The modifier may include a metal oxide of the metal ion conductive in the glass or ceramic. The network portion may include a metal chalcogenide such as, for example, a metal oxide or sulfide. For lithium metal and other lithium-containing electrodes, a single-ion conductive layer may be lithiated or contain lithium to allow passage of lithium ions across it. Single-ion conductive layers may include layers comprising a material such as lithium nitrides, lithium silicates, lithium borates, lithium aluminates, lithium phosphates, lithium phosphorus oxynitrides, lithium silicosulfides, lithium germanosulfides, lithium oxides (e.g., $Li_2O$, $LiO$, $LiO_2$, $LiRO_2$, where R is a rare earth metal), lithium lanthanum oxides, lithium titanium oxides, lithium borosulfides, lithium aluminosulfides, and lithium phosphosulfides, and combinations thereof. The selection of the single ion conducting material will be dependent on a number of factors including, but not limited to, the properties of electrolyte and cathode used in the cell.

In one set of embodiments, the single-ion conductive is a non-electroactive metal layer. The metal layer may comprise a metal alloy layer, e.g., a lithiated metal layer especially in the case where a lithium anode is employed. The lithium content of the metal alloy layer may vary from about 0.5% by weight to about 20% by weight, depending, for example, on the specific choice of metal, the desired lithium ion conductivity, and the desired flexibility of the metal alloy layer. Suitable metals for use in the single-ion conductive material include, but are not limited to, Al, Zn, Mg, Ag, Pb, Cd, Bi, Ga, In, Ge, Sb, As, and Sn. Sometimes, a combination of metals, such as the ones listed above, may be used in a single-ion conductive material.

The thickness of a single-ion conductive material layer (e.g., within a multi-layered structure) may vary over a range from about 1 nm to about 10 microns. For instance, the thickness of the single-ion conductive material layer may be between 1-10 nm thick, between 10-100 nm thick, between 100-1000 nm thick, between 1-5 microns thick, or between 5-10 microns thick. In some embodiments, the thickness of a single-ion conductive material layer may be no greater than, e.g., 10 microns thick, no greater than 5 microns thick, no greater than 1000 nm thick, no greater than 500 nm thick, no greater than 250 nm thick, no greater than 100 nm thick, no greater than 50 nm thick, no greater than 25 nm thick, or no greater than 10 nm thick. In certain embodiments, the single-ion conductive layer may have a thickness of greater than 10 nm, greater than 25 nm, greater than 50 nm, greater than 100 nm, greater than 250 nm, greater than 500 nm, greater than 1000 nm, or greater than 1500 nm. Other thicknesses are also possible. Combinations of the above-noted ranges are also possible. In some cases, the single-ion conductive layer has the same thickness as a polymer layer in a multi-layered structure.

The single-ion conductive layer may be deposited by any suitable method such as sputtering, electron beam evaporation, vacuum thermal evaporation, laser ablation, chemical vapor deposition (CVD), thermal evaporation, plasma enhanced chemical vacuum deposition (PECVD), laser enhanced chemical vapor deposition, and jet vapor deposition. The technique used may depend on the type of material being deposited, the thickness of the layer, etc.

Single ion-conductive layers (or other protective layers of a device as described herein) may include pinholes, cracks and/or grain boundary defects, e.g., depending on the process and conditions used for forming the layer. Once these defects are formed, they can grow/propagate through the entire thickness of the film as the film grows and may become worse as the film grows thicker. In one set of embodiments, the negative effects of the defects in a single ion-conductive layer may be reduced by filling at least a portion of the defects with a polymer. In another set of embodiments, by separating thin single ion-conductive layers from each other with thin, pinhole free, smooth polymer layers, the defect structure in each single ion-conductive layer can be decoupled from the defect structure in every other single ion-conductive layer by an intervening polymer layer.

At least one or more of the following advantages may be realized in structures including a single ion-conductive layer/polymer composite: (1) it is less likely for defects in one layer to be directly aligned with defects in another layer, and typically any defect in one layer is substantially non-aligned with a similar defect in another layer; (2) any defects in one single ion-conductive layer typically are much smaller and/or less detrimental than they would otherwise be in a thicker layer of otherwise similar or identical material.

Where alternating single-ion conductive layers and polymer layers are deposited atop each other in a fabrication process, each single-ion conductive layer may have a smooth, pinhole free, polymer surface upon which to grow. By contrast, where the single-ion conductive layer to be deposited atop another single-ion conductive layer (or continuously deposited as a single, thicker layer), defects in an underlying layer can serve to instigate defects in growth in a layer deposited atop an underlying layer. That is, whether a protective structure is built with thicker single-ion conductive layers or multiple single-ion conductive layers atop each other, defects can propagate through the thickness, or from layer to layer, as the structure grows, resulting in larger defects, and defects that propagate directly or substantially directly throughout the entire structure. In this arrangement, the single ion-conductive layers can also grow with fewer defects than would occur if they were deposited directly onto the rougher Li or electrolyte layers. Accordingly, in this arrangement, single ion-conductive layers can be made that have overall fewer defects, defects that are not aligned with defects in nearest other ion-conductive layers and, where defects exist, they are typically significantly less detrimental (e.g., smaller) than would otherwise exist in a continuously-grown, thicker structure or layers of the same or similar material deposited on top of each other.

Another advantage of a multi-layered structure includes the mechanical properties of the structure. The positioning of a polymer layer adjacent a single-ion conductive layer can decrease the tendency of the single-ion conductive layer to crack, and can increase the barrier properties of the structure. Thus, these laminates or composite structures may be more robust towards stress due to handling during the manufacturing process than structures without intervening polymer layers. In addition, a multi-layered structure can also have an increased tolerance of the volumetric changes that accompany the migration of lithium back and forth from the anode during the cycles of discharge and charge of the cell.

As described herein, in some embodiments, one or more single-ion conducting layers (e.g., protective layers) can be treated with a polymer such that at least a portion of the pinholes and/or pores (e.g., nanopores) of the single-ion conducting layer(s) are filled, partially or completely, with the polymer. Such embodiments can impede the diffusion of certain species (e.g., electrolyte and/or polysulfides) towards the anode, e.g., by increasing the distance, and tortuosity, through which such a species would need to pass to penetrate the entire multi-layer arrangement to arrive at the anode. In some embodiments, treatment may include filling only the pinholes and/or nanopores of the single-ion conductive layer and not forming a distinct polymer layer. In other embodiments, treatment may include filling the pinholes and/or nanopores of the single-ion conductive layer and forming a distinct polymer layer on the single-ion conductive layer.

A polymer may be deposited by methods such as electron beam evaporation, vacuum thermal evaporation, laser ablation, chemical vapor deposition, thermal evaporation, plasma assisted chemical vacuum deposition, laser enhanced chemical vapor deposition, jet vapor deposition, and extrusion. The polymer may also be deposited by spin-coating techniques. A method for depositing a crosslinked polymer includes flash evaporation methods, for example, as described in U.S. Pat. No. 4,954,371 to Yializis. A method for depositing a crosslinked polymer comprising lithium salts may include flash evaporation methods, for example, as described in U.S. Pat. No. 5,681,615 to Affinito et al. As described herein, the polymer may be in the form of a polymer layer in some embodiments. The technique used for depositing polymer layers may depend on the type of material being deposited, the thickness of the layer, etc.

The thickness of a polymer layer (e.g., within a multi-layered structure) may vary over a range from about 0.1 microns to about 10 microns. For instance, the thickness of the polymer layer may be between 0.05-0.15 microns thick, between 0.1-1 microns thick, between 1-5 microns thick, or between 5-10 microns thick. The thickness of a polymer layer may be no greater than, e.g., 10 microns thick, no greater than 5 microns thick, no greater than 2.5 microns thick, no greater than 1 micron thick, no greater than 500 nm thick, no greater than 250 nm thick, no greater than 100 nm thick, no greater than 50 nm thick, no greater than 25 nm thick, or no greater than 10 nm thick. In certain embodiments, the polymer layer may have a thickness of greater than 10 nm, greater than 25 nm, greater than 50 nm, greater than 100 nm, greater than 250 nm, greater than 500 nm, greater than 1 micron, greater than 1.5 microns. Other thicknesses are also possible. Combinations of the above-noted ranges are also possible.

In some embodiments including a multi-layered structure having more than one polymer layer, the thicknesses of the polymer layers can vary within the structure. For instance, in some cases, the polymer layer closest to the anode layer (e.g., a Li reservoir) is thicker than the other polymer layers of the structure. This embodiment can, for example, stabilize the anode by allowing lithium ions to plate out more uniformly across the surface of the anode during charge.

A multi-layered structure may have various overall thicknesses that can depend on, for example, the electrolyte, the cathode, or the particular use of the electrochemical cell. In some cases, a multi-layered structure can have an overall thickness less than or equal to 1 mm, less than or equal to 700 microns, less than or equal to 300 microns, less than or equal to 250 microns, less than or equal to 200 microns, less than or equal to 150 microns, less than or equal to 100 microns, less than or equal to 75 microns, less than or equal to 50 microns, less than or equal to 20 microns, less than or equal to 10 microns, less than or equal to 5 microns, or less than or equal to 2 microns. In certain embodiments, the multi-layered structure may have a thickness of greater than 100 nm, greater than 250 nm, greater than 500 nm, greater than 1 micron, greater than 2 microns, greater than 5 microns, greater than 10 microns, or greater than 20 microns. Other thicknesses are also possible. Combinations of the above-noted ranges are also possible.

Examples of multi-layered structures are described in more detail in U.S. patent application Ser. No. 11/400,025, issued as U.S. Pat. No. 7,771,870, and entitled "Electrode Protection in both Aqueous and Non-Aqueous Electrochemical Cells, including Rechargeable Lithium Batteries", which is incorporated herein by reference in its entirety for all purposes.

Suitable electroactive materials for use as cathode active materials in the cathode of the electrochemical cells described herein may include, but are not limited to, electroactive transition metal chalcogenides, electroactive conductive polymers, sulfur, carbon and/or combinations thereof. As used herein, the term "chalcogenides" pertains to compounds that contain one or more of the elements of oxygen, sulfur, and selenium. Examples of suitable transition metal chalcogenides include, but are not limited to, the electroactive oxides, sulfides, and selenides of transition metals selected from the group consisting of Mn, V, Cr, Ti, Fe, Co, Ni, Cu, Y, Zr, Nb, Mo, Ru, Rh, Pd, Ag, Hf, Ta, W, Re, Os, and Ir. In one embodiment, the transition metal chalcogenide is selected from the group consisting of the electroactive oxides of nickel, manganese, cobalt, and vanadium, and the electroactive sulfides of iron. In one embodiment, a cathode includes one or more of the following materials: manganese dioxide, iodine, silver chromate, silver oxide and vanadium pentoxide, copper oxide, copper oxyphosphate, lead sulfide, copper sulfide, iron sulfide, lead bismuthate, bismuth trioxide, cobalt dioxide, copper chloride, manganese dioxide, and carbon. In another embodiment, the cathode active layer comprises an electroactive conductive polymer. Examples of suitable electroactive conductive polymers include, but are not limited to, electroactive and electronically conductive polymers selected from the group consisting of polypyrroles, polyanilines, polyphenylenes, polythiophenes, and polyacetylenes. Examples of conductive polymers include polypyrroles, polyanilines, and polyacetylenes.

In some embodiments, electroactive materials for use as cathode active materials in electrochemical cells described herein include electroactive sulfur-containing materials. "Electroactive sulfur-containing materials," as used herein, relates to cathode active materials which comprise the element sulfur in any form, wherein the electrochemical activity involves the oxidation or reduction of sulfur atoms or moieties. The nature of the electroactive sulfur-containing materials useful in the practice of this invention may vary widely, as known in the art. For example, in one embodiment, the electroactive sulfur-containing material comprises elemental sulfur. In another embodiment, the electroactive sulfur-containing material comprises a mixture of elemental sulfur and a sulfur-containing polymer. Thus, suitable electroactive sulfur-containing materials may include, but are not limited to, elemental sulfur and organic materials comprising sulfur atoms and carbon atoms, which may or may not be polymeric. Suitable organic materials include those further comprising heteroatoms, conductive polymer segments, composites, and conductive polymers.

In some embodiments, the cathode may comprise one or more binder materials (e.g., polymers, porous silica sol-gel, etc.).

Examples of sulfur-containing polymers include those described in: U.S. Pat. Nos. 5,601,947 and 5,690,702 to Skotheim et al.; U.S. Pat. Nos. 5,529,860 and 6,117,590 to Skotheim et al.; U.S. Pat. No. 6,201,100 issued Mar. 13, 2001, to Gorkovenko et al. of the common assignee, and PCT Publication No. WO 99/33130. Other suitable electroactive sulfur-containing materials comprising polysulfide linkages are described in U.S. Pat. No. 5,441,831 to Skotheim et al.; U.S. Pat. No. 4,664,991 to Perichaud et al., and in U.S. Pat. Nos. 5,723,230, 5,783,330, 5,792,575 and 5,882,819 to Naoi et al. Still further examples of electroactive sulfur-containing materials include those comprising disulfide groups as described, for example in, U.S. Pat. No. 4,739,018 to Armand et al.; U.S. Pat. Nos. 4,833,048 and 4,917,974, both to De Jonghe et al.; U.S. Pat. Nos. 5,162,175 and 5,516,598, both to Visco et al.; and U.S. Pat. No. 5,324,599 to Oyama et al.

In one embodiment, an electroactive sulfur-containing material of a cathode active layer comprises greater than 50% by weight, greater than 60% by weight, greater than 70% by weight, greater than 80% by weight, or greater than 90% by weight of sulfur.

The cathode active layers of the present invention may comprise from about 20 to 100% by weight of electroactive cathode materials (e.g., as measured after an appropriate amount of solvent has been removed from the cathode active layer and/or after the layer has been appropriately cured). In one embodiment, the amount of electroactive sulfur-containing material in the cathode active layer is in the range of 5% to 30% by weight of the cathode active layer. In another embodiment, the amount of electroactive sulfur-containing material in the cathode active layer is in the range of 20% to 90% by weight of the cathode active layer (e.g., 50% to 90%, 60% to 90%, or 40% to 80% by weight of the cathode active layer.

Non-limiting examples of suitable liquid media (e.g., solvents) for the preparation of cathodes (as well as other components of cells described herein) include aqueous liquids, non-aqueous liquids, and mixtures thereof. In some embodiments, liquids such as, for example, water, methanol, ethanol, isopropanol, propanol, butanol, tetrahydrofuran, dimethoxyethane, acetone, toluene, xylene, acetonitrile, cyclohexane, and mixtures thereof can be used. Of course, other suitable solvents can also be used as needed.

Positive electrode layers may be prepared by methods known in the art. For example, one suitable method comprises the steps of: (a) dispersing or suspending in a liquid medium the electroactive sulfur-containing material, as described herein; (b) optionally adding to the mixture of step (a) a conductive filler and/or binder; (c) mixing the composition resulting from step (b) to disperse the electroactive sulfur-containing material; (d) casting the composition resulting from step (c) onto a suitable substrate; and (e) removing some or all of the liquid from the composition resulting from step (d) to provide the cathode active layer.

In some embodiments, the use of a cathode that is resistant to compression can enhance the performance of the cell relative to cells in which the cathode is significantly compressible. Not wishing to be bound by any theory, the use of elastic, relatively highly compressible cathodes may result in the evacuation of liquid electrolyte during the application of the anisotropic force. The evacuation of liquid electrolyte from the cathode may result in decreased power output during the operation of the electrolytic cell. For example, in some cases a decrease in power output from the electrolytic cell may be observed even when the anisotropic force is relatively small (e.g., an anisotropic force with a component normal to an active surface of the anode defining a pressure of about 68.6 Newtons/cm$^2$) or when the anisotropic force is of another magnitude, for example, as noted above with reference to limits and ranges of the component of the anisotropic force normal to the anode active surface. The degree of compressibility can be correlated to a change in porosity, i.e., change in void volume of the cathode, during application of a compressive force. In some embodiments, it may be desirable to limit the change in porosity of the cathode during the operation of the cell. For example, in some embodiments of the invention, the porosity of the cathode may be decreased during operation of the cell by less than 10%, less than 6%, less than 4%, less than 2%, less than 1%, less than 0.5%, less than 0.1%, or lower. That is, during use of the cell, a compressive force experienced by the cathode may reduce the total void volume, or total volume otherwise accessible by the electrolyte, by percentages noted above, where the cathode is fabricated to provide suitable resistance to compression.

The stiffness of the cathode (resistance to compressibility) may be enhanced using a variety of methods. In some embodiments, the type of electrolyte and the size of the pores in the cathode may be together selected such that the resulting capillary forces produced by the interaction of the electrolyte and the cathode pores resist the deformation of the cathode. This effect may be particularly useful, for example, in small electrolytic cells. As another example, the stiffness of the cathode may be enhanced by incorporating reinforcement fibers (e.g., to connect carbon particles) into the cathode. In other embodiments, an inherently rigid cathode may be produced by infusing active material (e.g., reticulated Ni foam) into a thin and light superstructure.

In some embodiments, the cathode may comprise one or more binder materials (e.g., polymers, porous silica sol-gel, etc.) which may, among other functions, provide rigidity. Examples of suitable binders for use in cathodes are described herein and may include, for example, polyvinyl alcohol, polyvinylidine fluoride and its derivatives, hydrocarbons, polyethylene, polystyrene, polyethylene oxide and any polymers including hydrocarbon fragments and heteroatoms. The amount of binder within the cathode may be relatively low in some cases. For example, the cathode may contain less than about 20%, less than about 10%, less than about 5%, less than about 2%, or less than about 1% binder by weight in some embodiments. The use of a relatively low amount of binder may allow for improved fluid communication between the electrolyte and the electrode active materials (cathode active material such as sulfur or anode active material such as lithium) and/or between the electrolyte and the electrode conductive material. In addition, the use of a low amount of binder may lead to improved contact between the electrode active material and the electrode conductive material (e.g., carbon) or improved contact within the electrode conductive material itself (e.g., carbon-carbon contact).

Certain cathodes used in lithium metal rechargeable batteries may include a carbon-based component, sulfur, and a binder or other material of some sort to facilitate internal cohesion of the cathode. In some embodiments, application of pressure to a cathode before and/or during use (e.g., cycling) can reduce the need for binder or other adhesive which can increase the overall surface area of carbon available for facilitating both internal electrode conductivity and electrical communication with sulfur, and with electrolyte to which the cathode is exposed. Thus, even if void volume of a cathode is reduced by application of pressure (i.e., reduction of a volume within the cathode which can be taken up by electrolyte), relative to an essentially identical cathode absent application of this pressure, performance of the cathode and an overall device utilizing the cathode can be improved. The cathodes described herein may possess enhanced properties that render them particularly suitable for use in electrochemical cells designed to be charged and/or discharged while a force is applied.

The cathodes described herein may retain their mechanical integrity when charged and/or discharged during the application of an anisotropic force (e.g., defining a pressure described herein). In some embodiments, the yield strength of the cathode is greater than 1 times, greater than 1.2 times, greater than 1.5 times, greater than 2 times, greater than 3 times, greater than 4 times, greater than 5 times the yield strength of the electroactive material. In some embodiments, the yield strength of the cathode is greater than 1 times, greater than 1.2 times, greater than 1.5 times, greater than 2 times, greater than 3 times, greater than 4 times, greater than 5 times the normal component of the pressure that is applied to the article (e.g., during fabrication and/or use). Additional values of yield strength are described in more detail below. Combinations of the above-noted ranges are also possible.

In some embodiments, the cathode retains sufficient porosity to charge and discharge effectively when a force is applied to the cell. Cathodes described herein may also comprise relatively high electrolyte-accessible conductive material (e.g., carbon) areas. The cathode may comprise a relatively low ratio of the amount of binder and/or mass of electrolyte to cathode active material (e.g., sulfur) ratio in some instances. In some embodiments, electrochemical cells comprising the cathodes described herein may achieve relatively high specific capacities and/or relatively high discharge current densities. In addition, the cathodes described herein may exhibit relatively high cathode active material (e.g., sulfur) utilization during charge and discharge. In still further cases, the electrical conductivity between conductive material in the cathode (e.g., carbon) may be enhanced during the application of the force.

Cathodes described herein may comprise one or more properties that render them effective in delivering enhanced performance. In some instances, the cathodes may exhibit one or more of the properties outlined herein during the application of an anisotropic force, the magnitude of which may lie within any of the ranges described herein.

In certain embodiments, cathodes described herein may exhibit relatively high porosities. In some cases, the porosity of the cathode may be at least about 30%, at least about 40%, at least about 50%, at least about 60%, at least about 70%, at least about 80%, or at least about 90%. Such porosities may be retained, in some cases, while an anisotropic force (e.g., defining a pressure of between about 4.9 and about 196 Newtons per square centimeter, or any of the ranges outlined below) is applied to the electrochemical cell. As used herein, the "porosity" of an electrode (e.g., the cathode) is defined as the void volume of the electrode divided by the volume within the outer boundary of the electrode, and is expressed as a percentage. "Void volume" is used to refer to portions of the cathode that are not occupied by cathode active material (e.g., sulfur), conductive material (e.g., carbon), binder, or other materials that provide structural support. The void volume within the cathode may comprise pores in the cathode as well as interstices between aggregates of the cathode material. Void volume may be occupied by electrolyte, gases, or other non-cathode materials. In some embodiments, the void volume of the cathode may be at least about 1, at least about 2, at least about 4, or at least about 8 cm$^3$ per gram of cathode active material (e.g., sulfur) in the cathode. In some instances, the void volume may comprise pores with relatively large diameters. For example, in some embodiments, pores of a diameter of at least about 200 nm constitute at least about 50% of the void volume in the cathode.

As noted above, in some embodiments, compressing a cathode facilitates cathode integrity, where the cathode has relatively less binder or adhesive than otherwise might be required to maintain integrity, and such compression may improve performance of the cathode and/or a device into which the cathode is incorporated. This improvement can be realized even if void volume of the cathode (and/or the relative amount of electrolyte present in the cathode during use) is reduced. It can also be useful, in combination with embodiments described herein, to select a cathode that is resistant to compression to enhance the performance of the cell relative to cells in which the cathode is significantly compressible. For example, using a compression resistant cathode may help maintain high porosities or void volumes during the application of an anisotropic force to the cell. Not wishing to be bound by any theory, the use of elastic, relatively highly compressible cathodes may result in the evacuation of liquid electrolyte during the application of the anisotropic force. The evacuation of liquid electrolyte from the cathode may result in decreased power output during the operation of the electrochemical cell. The use of compressible cathodes may cause a decrease in power output from the electrochemical cell even when the anisotropic force is relatively small (e.g., an anisotropic force defining a pressure of about 68.6 Newtons per square centimeter) or when the anisotropic force is of another magnitude, for example, as noted below with reference to limits and ranges of the component of the anisotropic force normal to the anode active surface.

The degree of compressibility can be correlated to a change in porosity, i.e., change in void volume of the cathode, during application of a compressive force. In some embodiments, it may be desirable to limit the change in porosity of the cathode during the operation of the cell. For example, in some embodiments of the invention, the porosity of the cathode may be decreased during operation of the cell by less than about 10%, less than about 6%, less than about 4%, less than about 2%, less than about 1%, less than about 0.5%, less than about 0.1%, or lower. That is, during use of the cell, a compressive force experienced by the cathode may reduce the total void volume, or total volume otherwise accessible by the electrolyte, by percentages noted above, where the cathode is fabricated to provide suitable resistance to compression. Electrochemical cells and other devices comprising cathodes described herein may achieve high levels of performance despite having lower porosities during the application of a force than would be observed absent the force.

The type of electrolyte and the size of the pores in the cathode may be together selected such that the resulting capillary forces produced by the interaction of the electrolyte and the cathode pores resist the deformation of the cathode. This effect may be particularly useful, for example, in small electrochemical cells. As another example, the stiffness of the cathode may be enhanced by incorporating reinforcement fibers (e.g., to connect carbon particles) into the cathode.

In some embodiments, the cathode comprises a relatively large electrolyte accessible conductive material area. As used herein, "electrolyte accessible conductive material area" is used to refer to the total surface area of the conductive material (e.g., carbon) that can be contacted by electrolyte. For example, electrolyte accessible conductive material area may comprise conductive material surface area within the pores of the cathode, conductive material surface area on the external surface of the cathode, etc. In some instances, electrolyte accessible conductive material area is not obstructed by binder or other materials. In addition, in some embodiments, electrolyte accessible conductive material area does not include portions of the conductive material that reside within pores that restrict electrolyte flow due to surface tension effects. In some cases, the cathode comprises an electrolyte accessible conductive material area (e.g., an electrolyte accessible carbon area) of at least about 1 $m^2$, at least about 5 $m^2$, at least about 10 $m^2$, at least about 20 $m^2$, at least about 50 $m^2$, or at least about 100 $m^2$ per gram of cathode active material (e.g., sulfur) in the cathode.

Electrochemical cells described herein may make use of a relatively low mass of electrolyte relative to the mass of the cathode active material. For example, in some instances, the ratio of electrolyte to cathode active material (e.g., sulfur), by mass, within the electrochemical cell is less than about 6:1, less than about 5:1, less than about 4:1, or less than about 3:1.

As mentioned above, some embodiments may include electrochemical devices in which the application of force is used to enhance the performance of the device. Any of the performance metrics outlined herein may be achieved, alone or in combination with each other, while an anisotropic force is applied to the electrochemical cell (e.g., during charge and/or discharge of the cell). The magnitude of the anisotropic force may lie within any of the ranges mentioned herein.

In some instances, the cathode structure and/or material and the anisotropic force may be together selected such that the anisotropic force increases the conductivity within the cathode through charge and discharge compared to the conductivity in the absence of the anisotropic force but under otherwise essentially identical conditions.

Additional arrangements, components, and advantages of electrochemical cells including cathodes that are structurally stable under pressure are provided in U.S. patent application Ser. No. 12/727,862, filed Mar. 19, 2010, entitled, "Cathode for Lithium Battery", which is incorporated herein by reference in its entirety.

Suitable electroactive materials for use as anode active materials in the anode of the electrochemical cells described herein include, but are not limited to, lithium metal such as lithium foil and lithium deposited onto a conductive substrate, and lithium alloys (e.g., lithium-aluminum alloys and lithium-tin alloys). While these are preferred negative electrode materials, the current collectors may also be used with other cell chemistries. In some embodiments, the anode may comprise one or more binder materials (e.g., polymers, etc.).

In one embodiment, an electroactive lithium-containing material of an anode active layer comprises greater than 50% by weight of lithium. In another embodiment, the electroactive lithium-containing material of an anode active layer comprises greater than 75% by weight of lithium. In yet another embodiment, the electroactive lithium-containing material of an anode active layer comprises greater than 90% by weight of lithium.

Methods for depositing a negative electrode material (e.g., an alkali metal anode such as lithium) onto a substrate may include methods such as thermal evaporation, sputtering, jet vapor deposition, and laser ablation. Alternatively, where the anode comprises a lithium foil, or a lithium foil and a substrate, these can be laminated together by a lamination process as known in the art to form an anode.

The layers of an electrode and/or electrode described herein may be deposited by any of a variety of methods generally known in the art, such as physical or chemical vapor deposition methods, extrusion, and electroplating. Examples of suitable physical or chemical vapor deposition methods include, but are not limited to, thermal evaporation (including, but not limited to, resistive, inductive, radiation, and electron beam heating), sputtering (including, but not limited to, diode, DC magnetron, RF, RF magnetron, pulsed, dual magnetron, AC, MF, and reactive), chemical vapor deposition, plasma enhanced chemical vapor deposition, laser enhanced chemical vapor deposition, ion plating, cathodic arc, jet vapor deposition, and laser ablation.

Deposition of the layers may be carried out in a vacuum or inert atmosphere to minimize side reactions in the deposited layers which could introduce impurities into the layers or which may affect the desired morphology of the layers. In some embodiments, the layers of a multi-layered structure are deposited in a continuous fashion in a multistage deposition apparatus.

In some embodiments, an electroactive layer is formed at least in part by condensing lithium vapor onto a substrate in the presence of a gaseous material to co-deposit the electroactive layer. In certain embodiments, a gaseous material is used to passivated a surface of the electroactive layer (e.g., prior to forming a protective layer on the surface of the electroactive layer). The gaseous material may be, for example, any suitable gaseous material that is able to react with the electroactive material. In some embodiments, the gaseous material is selected from one or more of the group consisting of carbon dioxide, acetylene, nitrogen, nitrous oxide, nitrogen dioxide, ethylene, sulfur dioxide, hydrocarbons, alkyl phosphate esters, alkyl sulfite esters, and alkyl sulfate esters. Other gaseous materials can also be used.

Positive and/or negative electrodes may optionally include one or more layers that interact favorably with a suitable electrolyte, such as those described in International Patent Publication No. WO/2008/070059, filed Jun. 12, 2008 and entitled "Separation of Electrolytes," by Mikhaylik et al., which is incorporated herein by reference in its entirety.

The articles described herein may further comprise a substrate, as is known in the art. Substrates are useful as a support on which to deposit the anode active material, and may provide additional stability for handling of thin lithium film anodes during cell fabrication. Further, in the case of conductive substrates, a substrate may also function as a current collector useful in efficiently collecting the electrical current generated throughout the anode and in providing an efficient surface for attachment of electrical contacts leading to an external circuit. A wide range of substrates are known in the art of anodes. Suitable substrates include, but are not limited to, those selected from the group consisting of metal foils, polymer films, metallized polymer films, electrically conductive polymer films, polymer films having an electrically conductive coating, electrically conductive polymer films having an electrically conductive metal coating, and polymer films having conductive particles dispersed therein. In one embodiment, the substrate is a metallized polymer film. In other embodiments, described more fully below, the substrate may be selected from non-electrically-conductive materials.

The electrolytes used in electrochemical or battery cells can function as a medium for the storage and transport of ions, and in the special case of solid electrolytes and gel electrolytes, these materials may additionally function as a separator between the anode and the cathode. Any liquid, solid, or gel material capable of storing and transporting ions may be used, so long as the material facilitates the transport of ions (e.g., lithium ions) between the anode and the cathode. The electrolyte is electronically non-conductive to prevent short circuiting between the anode and the cathode. In some embodiments, the electrolyte may comprise a non-solid electrolyte.

In some embodiments, an electrolyte layer described herein may have a thickness of at least 1 micron, at least 5 microns, at least 10 microns, at least 15 microns, at least 20 microns, at least 25 microns, at least 30 microns, at least 40 microns, at least 50 microns, at least 70 microns, at least 100 microns, at least 200 microns, at least 500 microns, or at least 1 mm. In some embodiments, the thickness of the electrolyte layer is less than or equal to 1 mm, less than or equal to 500 microns, less than or equal to 200 microns, less than or equal to 100 microns, less than or equal to 70 microns, less than or equal to 50 microns, less than or equal to 40 microns, less than or equal to 30 microns, less than or equal to 20 microns, less than or equal to 10 microns, or less than or equal to 50 microns. Other values are also possible. Combinations of the above-noted ranges are also possible.

The electrolyte can comprise one or more ionic electrolyte salts to provide ionic conductivity and one or more liquid electrolyte solvents, gel polymer materials, or polymer materials. Suitable non-aqueous electrolytes may include organic electrolytes comprising one or more materials selected from the group consisting of liquid electrolytes, gel polymer electrolytes, and solid polymer electrolytes. Examples of non-aqueous electrolytes for lithium batteries are described by Dorniney in Lithium Batteries, New Materials, Developments and Perspectives, Chapter 4, pp. 137-165, Elsevier, Amsterdam (1994). Examples of gel polymer electrolytes and solid polymer electrolytes are described by Alamgir et al. in Lithium Batteries, New Materials, Developments and Perspectives, Chapter 3, pp. 93-136, Elsevier, Amsterdam (1994). Heterogeneous electrolyte compositions that can be used in batteries described herein are described in International Patent Publication No. WO/2008/070059, filed Jun. 12, 2008.

Examples of useful non-aqueous liquid electrolyte solvents include, but are not limited to, non-aqueous organic solvents, such as, for example, N-methyl acetamide, acetonitrile, acetals, ketals, esters, carbonates, sulfones, sulfites, sulfolanes, aliphatic ethers, acyclic ethers, cyclic ethers, glymes, polyethers, phosphate esters, siloxanes, dioxolanes, N-alkylpyrrolidones, substituted forms of the foregoing, and blends thereof. Examples of acyclic ethers that may be used include, but are not limited to, diethyl ether, dipropyl ether, dibutyl ether, dimethoxymethane, trimethoxymethane, dimethoxyethane, diethoxyethane, 1,2-dimethoxypropane, and 1,3-dimethoxypropane. Examples of cyclic ethers that may be used include, but are not limited to, tetrahydrofuran, tetrahydropyran, 2-methyltetrahydrofuran, 1,4-dioxane, 1,3-dioxolane, and trioxane. Examples of polyethers that may be used include, but are not limited to, diethylene glycol dimethyl ether (diglyme), triethylene glycol dimethyl ether (triglyme), tetraethylene glycol dimethyl ether (tetraglyme), higher glymes, ethylene glycol divinylether, diethylene glycol divinylether, triethylene glycol divinylether, dipropylene glycol dimethyl ether, and butylene glycol ethers. Examples of sulfones that may be used include, but are not limited to, sulfolane, 3-methyl sulfolane, and 3-sulfolene. Fluorinated derivatives of the foregoing are also useful as liquid electrolyte solvents. Mixtures of the solvents described herein can also be used.

In some cases, aqueous solvents can be used as electrolytes for lithium cells. Aqueous solvents can include water, which can contain other components such as ionic salts. In some embodiments, the electrolyte can include species such as lithium hydroxide, or other species rendering the electrolyte basic, so as to reduce the concentration of hydrogen ions in the electrolyte.

As described herein, in some embodiments, an electrolyte may be present as a polymer layer adjacent a protective structure (e.g., on a side opposite the current collector). The polymer layer may be, in some embodiments, a gel polymer layer. In some cases, in addition to being able to function as a medium for the storage and transport of ions, a polymer layer positioned between an anode and cathode can function to screen the anode (e.g., a base electrode layer of the anode) from any cathode roughness under an applied force or pressure, keeping the anode surface smooth under force or pressure, and stabilizing any multi-layered structures of the anode (e.g., ceramic polymer multi-layer) by keeping the multilayer pressed between the base electrode layer and the smooth polymer layer. In some such embodiments, the polymer layer may be chosen to be compliant and have a smooth surface.

An electrolyte layer including a gel may have a three-dimensional network comprising a liquid and a binder component, in which the liquid is entrained by and not allowed to flow through the binder. Gels can be formed when liquids are entrained within a three-dimensional network of solids upon applying the liquid to the solid network. In some cases, the three-dimensional network within a gel can comprise a liquid entrained within a polymer (e.g., a cross-linked polymer).

One of ordinary skill in the art would be capable of determining the difference between a gel and other combinations of a solid and a fluid (e.g., a porous separator and a liquid solvent) by measuring, for example, the absorption stiffness of the gel via a dibutyl phthalate (DBP) uptake test. For this test, a dry sample of the binder material is weighed. The weighed sample is immersed in DBP for 30 min. The excess DBP is removed by absorbent paper and the sample is weighed again. Generally, upon exposure of the binder component of a gel to a liquid, the weight of the gel will increase, while the weight of a porous separator will not substantially increase. In some embodiments, the binder component of the gel is able to take up liquid in the substantial absence of pores greater than about 10 microns or greater than about 1 micron. The binder component of a gel can be substantially free of pores in some cases.

In some embodiments, an electrolyte comprising a polymer gel is formed by using a hard ionically conductive polymer and optionally swelling at least a portion of the polymer in a solvent to form a gel. In another embodiment, a mixture of hard and softer polymers can be used, in which at least one, or both, of such polymers is ionically conductive. In another embodiment, an electrolyte includes a rigid, non-swelling scaffold (e.g., like a standard separator as described herein), which is filled with a polymer, such as a conductive polymer. The above-noted embodiments may optionally include particles (e.g., silica particles added to the polymers). In some embodiments, the above-noted embodiments may optionally include some degree of crosslinking. The polymers may be swollen in a solvent as described herein.

In some embodiments, a polymer gel may include a polyethersulfone. Polyethersulfones are polymeric materials that exhibit $SO_2$ groups (sulfonyl groups) and oxygen atoms that form part of ether groups in their constitutional repeating units. Polyethersulfones can be aliphatic, cycloaliphatic or aromatic polyethersulfones. In certain embodiments, one or more branched polyimide, polyvinylalcohol or a blend of polyvinylalcohol (PVOH) and additional (co)polymer(s) can be used.

A polymer electrolyte gel may include, in some embodiments, materials based on a polymer (e.g., non-porous polyvinylalcohol) as a non-fluid material swollen with a solvent having affinity to the polymer. E.g., for PVOH, the solvent may include dimethylacetamide (DMAc), N-methylpyrolidone (NMP), dimethylsulfoxide (DMSO), dimethylformamide (DMF), sulfolanes and/or sulfones. In certain embodiments, the polymer may be swollen in a solvent mixture comprising a solvent having affinity to polymer and also solvents having no affinity to the polymer (so-called nonsolvents) such as, for PVOH, 1,2.dimethoxyethane (DME), diglyme, triglyme, 1.3-dioxolane (DOL), THF, 1,4-dioxane, cyclic and linear ethers, esters (carbonates as dimethylcarbonate and ethylene carbonate), acetals and ketals. The solvents for preparing the polymer gel may be selected from the solvents described herein and may comprise electrolyte salts, including lithium salts selected from the lithium salts described herein.

In certain embodiments, polymer electrolyte gels may be prepared from branched and hyperbranched polyimides. Hyperbranched polyimides are a subclass of branched polyimides. They are composed of highly branched macromolecules in which any linear subchain may lead in either direction to at least two other subchains.

In other embodiments, polymer electrolyte gels may be prepared materials such as cyanoethylated cellulose, polyether ether ketones and sulfonated polyether ether ketones.

In some embodiments a polymer gel is crosslinked with a suitable cross-linker. Examples of cross-linkers may include ones selected from molecules with two or more carbon-carbon double bonds, e.g., ones with two or more vinyl groups. Particularly useful cross-linkers are selected from di(meth)acrylates of diols such as glycol, propylene glycol, diethylene glycol, dipropylene glycol, 1,3-propanediol, 1,4-butanediol, triethylene glycol, tetrapropylene glycol, cyclopentadiene dimer, 1,3-divinyl benzene, and 1,4-divinyl benzene. Some suitable cross-linkers may comprise two or more epoxy groups in the molecule, such as, for example, bis-phenol F, bis-phenol A, 1,4-butanediol diglycidyl ether, glycerol propoxylate triglycidyl ether, and the like. Cross-linking can be achieved by, for example, adding cross-linker to a polymer and performing a cross-linking reaction, e.g., by thermal or photochemical curing, e.g. by irradiation with such as UV/vis irradiation, by γ-irradiation, electron beams (e-beams) or by heating (thermal cross-linking).

In some embodiments, one or more solid polymers can be used to form an electrolyte. Examples of useful solid polymer electrolytes include, but are not limited to, those comprising one or more polymers selected from the group consisting of polyethers, polyethylene oxides, polypropylene oxides, polyimides, polyphosphazenes, polyacrylonitriles, polysiloxanes, derivatives of the foregoing, copolymers of the foregoing, crosslinked and network structures of the foregoing, and blends of the foregoing.

Liquid electrolyte solvents can also be useful as plasticizers for gel polymer electrolytes, i.e., electrolytes comprising one or more polymers forming a semi-solid network. Examples of useful gel polymer electrolytes include, but are not limited to, those comprising one or more polymers selected from the group consisting of polyethylene oxides, polypropylene oxides, polyacrylonitriles, polysiloxanes, polyimides, polyphosphazenes, polyethers, sulfonated polyimides, perfluorinated membranes (NAFION resins), polydivinyl polyethylene glycols, polyethylene glycol diacrylates, polyethylene glycol dimethacrylates, derivatives of the foregoing, copolymers of the foregoing, crosslinked and network structures of the foregoing, and blends of the foregoing, and optionally, one or more plasticizers. In some embodiments, a gel polymer electrolyte comprises between 10-20%, 20-40%, between 60-70%, between 70-80%, between 80-90%, or between 90-95% of a heterogeneous electrolyte by volume.

In one set of embodiments, an electrolyte layer comprises a polymer (e.g., a polyethersulfone) in its gel state, at least one organic solvent, at least one salt of lithium, optionally an additional (co)polymer, and optionally one or more organic or inorganic fillers.

In addition to electrolyte solvents, gelling agents, and polymers as known in the art for forming electrolytes, the electrolyte may further comprise one or more ionic electrolyte salts, also as known in the art, to increase the ionic conductivity.

Examples of ionic electrolyte salts for use in the electrolytes of the present invention include, but are not limited to, LiSCN, LiBr, LiI, $LiCLO_4$, $LiAsF_6$, $LiSO_3CF_3$, $LiSO_3CH_3$, $LiBF_4$, $LiB(Ph)_4$, $LiPF_6$, $LiC(SO_2CF_3)_3$, and $LiN(SO_2CF_3)_2$. Other electrolyte salts that may be useful include lithium polysulfides ($Li_2S_x$), and lithium salts of organic ionic polysulfides ($LiS_xR)_n$, where x is an integer from 1 to 20, n is an integer from 1 to 3, and R is an organic group, and those disclosed in U.S. Pat. No. 5,538,812 to Lee et al.

In some embodiments, electrochemical cells may further comprise a separator interposed between the cathode and anode. The separator may be, in some embodiments, a solid non-conductive or insulative material which separates or insulates the anode and the cathode from each other preventing short circuiting, and which permits the transport of ions between the anode and the cathode. In some embodiments, the porous separator may be permeable to the electrolyte.

The pores of the separator may be partially or substantially filled with electrolyte. For example, in some embodiments a separator includes in the pores a polymer gel as described herein. The separator may give the electrolyte layer structural support and the polymer gel may allow the appropriate ionic conductivity across the separator. In some embodiments, the pores of the separator may be large enough to not inhibit transport of ions, yet be small enough to give structural support to the electrochemical cell (e.g., to have a particular yield strength).

Accordingly, in certain embodiments, an electrolyte layer may include a solid portion (e.g., a solid porous network such as a solid electrolyte and/or a separator) and a liquid portion and/or gel portion as described herein. The pores of the solid portion of the electrolyte layer may have an average size of, for example, greater than 0.01 microns, greater than 0.05 microns, greater than 0.1 microns, greater than 0.5 microns, greater than 1 micron, greater than 2 microns, or greater than 5 microns. In some cases, the pores of the solid portion of the electrolyte layer may have an average size of, for example, less than 5 microns, less than 3 microns, less than 2 microns, less than 1 micron, less than 0.5 microns, less than 0.1 microns, less than 0.05 microns, or less than 0.1 microns. Other sizes are also possible. Combinations of the above-noted ranges are also possible.

In some embodiments, the porosity of separator can be, for example, at least 30%, at least 40%, at least 50%, at least 60%, at least 70%, at least 80%, or at least 90%. In certain embodiments, the porosity is less than 90%, less than 80%, less than 70%, less than 60%, less than 50%, less than 40%, or less than 30%. Other sizes are also possible. Combinations of the above-noted ranges are also possible.

Separators may be supplied as porous free standing films which are interleaved with the anodes and the cathodes during the fabrication of cells. Alternatively, the porous separator layer may be applied directly to the surface of one of the electrodes, for example, as described in PCT Publication No. WO 99/33125 to Carlson et al. and in U.S. Pat. No. 5,194,341 to Bagley et al.

A variety of separator materials are known in the art. Examples of suitable solid porous separator materials include, but are not limited to, polyolefins, such as, for example, polyethylenes (e.g., SETELA™ made by Tonen Chemical Corp) and polypropylenes, glass fiber filter papers, and ceramic materials. For example, in some embodiments, the separator comprises a microporous polyethylene film. Further examples of separators and separator materials suitable for use in this invention are those comprising a microporous xerogel layer, for example, a microporous pseudo-boehmite layer, which may be provided either as a free standing film or by a direct coating application on one of the electrodes, as described in U.S. Pat. Nos. 6,153,337 and 6,306,545 by Carlson et al. of the common assignee. Solid electrolytes and gel electrolytes may also function as a separator in addition to their electrolyte function.

In some embodiments, the separator can comprise synthetic or non-synthetic organic polymeric materials, and can be selected from polymer/ceramic material hybrid systems such as polymer non-woven materials coated with a ceramic material. Suitable materials for the separator are polyolefins (e.g., polyethylene or polypropylene) and fluorinated (co) polymers. The separator can comprise a microporous film, in some cases.

In some embodiments, an electrochemical cell described herein has a relatively high absolute discharge capacity at the end of a certain cycle of the electrochemical cell. For example, an electrochemical cell may have an absolute discharge capacity at the end of the $30^{th}$, $50^{th}$, $70^{th}$, or $100^{th}$ cycle of, for example, at least 800 mAh/g of sulfur (e.g., sulfur present in the cathode), at least 1000 mAh/g of sulfur, at least 1200 mAh/g of sulfur, at least 1400 mAh/g of sulfur, at least 1600 mAh/g of sulfur, or at least 1800 mAh/g of sulfur. Such discharge capacities may be present in an electrochemical cell including an electroactive material layer having a thickness of, for example, less than or equal to 50 microns, less than or equal to 40 microns, less than or equal to 30 microns, less than or equal to 20 microns, or less than or equal to 10 microns. In other embodiments, an electrochemical cell described herein has an energy density of at least 100 Wh/kg, at least 150 Wh/kg, at least 200 Wh/kg, at least 250 Wh/kg, at least 300 Wh/kg, at least 350 Wh/kg, or at least 400 Wh/kg.

The following documents are incorporated herein by reference in their entireties for all purposes: U.S. Pat. No. 7,247,408, filed May 23, 2001, entitled "Lithium Anodes for Electrochemical Cells"; U.S. Pat. No. 5,648,187, filed Mar. 19, 1996, entitled "Stabilized Anode for Lithium-Polymer Batteries"; U.S. Pat. No. 5,961,672, filed Jul. 7, 1997, entitled "Stabilized Anode for Lithium-Polymer Batteries"; U.S. Pat. No. 5,919,587, filed May 21, 1997, entitled "Novel Composite Cathodes, Electrochemical Cells Comprising Novel Composite Cathodes, and Processes for Fabricating Same"; U.S. patent application Ser. No. 11/400,781, filed Apr. 6, 2006, published as U.S. Pub. No. 2007-0221265, and entitled "Rechargeable Lithium/Water, Lithium/Air Batteries"; International Patent Apl. Serial No.: PCT/US2008/009158, filed Jul. 29, 2008, published as International Pub. No. WO/2009017726, and entitled "Swelling Inhibition in Lithium Batteries"; U.S. patent application Ser. No. 12/312,764, filed May 26, 2009, published as U.S. Pub. No. 2010-0129699, and entitled "Separation of Electrolytes"; International Patent Apl. Serial No. PCT/US2008/012042, filed Oct. 23, 2008, published as International Pub. No. WO/2009054987, and entitled "Primer for Battery Electrode"; U.S. patent application Ser. No. 12/069,335, filed Feb. 8, 2008, published as U.S. Pub. No. 2009-0200986, and entitled "Protective Circuit for Energy-Storage Device"; U.S. patent application Ser. No. 11/400,025, issued as U.S. Pat. No. 7,771,870, and entitled "Electrode Protection in both Aqueous and Non-Aqueous Electrochemical Cells, including Rechargeable Lithium Batteries"; U.S. patent application Ser. No. 11/821,576, filed Jun. 22, 2007, published as U.S. Pub. No. 2008/0318128, and entitled "Lithium Alloy/Sulfur Batteries"; patent application Ser. No. 11/111,262, filed Apr. 20, 2005, published as U.S. Pub. No. 2006-0238203, and entitled "Lithium Sulfur Rechargeable Battery Fuel Gauge Systems and Methods"; U.S. patent application Ser. No. 11/728,197, filed Mar. 23, 2007, published as U.S. Pub. No. 2008-0187663, and entitled "Co-Flash Evaporation of Polymerizable Monomers and Non-Polymerizable Carrier Solvent/Salt Mixtures/Solutions"; International Patent Apl. Serial No. PCT/US2008/010894, filed Sep. 19, 2008, published as International Pub. No. WO/2009042071, and entitled "Electrolyte Additives for Lithium Batteries and Related Methods"; International Patent Apl. Serial No. PCT/US2009/000090, filed Jan. 8, 2009, published as International Pub. No. WO/2009/089018, and entitled "Porous Electrodes and Associated Methods"; U.S. patent application Ser. No. 12/535,328, filed Aug. 4, 2009, published as U.S. Pub. No. 2010/0035128, and entitled "Application of Force In Electrochemical Cells"; U.S. patent application Ser. No.

12/727,862, filed Mar. 19, 2010, entitled "Cathode for Lithium Battery"; U.S. patent application Ser. No. 12,471, 095, filed May 22, 2009, entitled "Hermetic Sample Holder and Method for Performing Microanalysis Under Controlled Atmosphere Environment"; U.S. patent application Ser. No. 12/862,513, filed on Aug. 24, 2010, entitled "Release System for Electrochemical cells (which claims priority to Provisional Patent Apl. Ser. No. 61/236,322, filed Aug. 24, 2009, entitled "Release System for Electrochemical Cells"); U.S. patent application Ser. No. 13/216,559, filed on Aug. 24, 2011, entitled "Electrically Non-Conductive Materials for Electrochemical Cells" [S1583.70027US01]; U.S. Provisional patent application Ser. No. 12/862,528, filed on Aug. 24, 2010, published as U.S. Pub. No. 2011/0177398, entitled "Electrochemical Cell" [S1583.70028US00]; U.S. patent application Ser. No. 12/862,563, filed on Aug. 24, 2010, published as U.S. Pub. No. 2011/0070494, entitled "Electrochemical Cells Comprising Porous Structures Comprising Sulfur" [S1583.70029US00]; U.S. patent application Ser. No. 12/862,551, filed on Aug. 24, 2010, published as U.S. Pub. No. 2011/0070491, entitled "Electrochemical Cells Comprising Porous Structures Comprising Sulfur" [S1583.70030US00]; U.S. patent application Ser. No. 12/862,576, filed on Aug. 24, 2010, published as U.S. Pub. No. 2011/0059361, entitled "Electrochemical Cells Comprising Porous Structures Comprising Sulfur" [S1583.70031US00]; U.S. patent application Ser. No. 12/862,581, filed on Aug. 24, 2010, published as U.S. Pub. No. 2011/0076560, entitled "Electrochemical Cells Comprising Porous Structures Comprising Sulfur" [S1583.70024US01]; U.S. patent application Ser. No. 13/240,113, filed on Sep. 22, 2011, published as US2012/0070746, entitled "Low Electrolyte Electrochemical Cells" [S1583.70033US01]; U.S. patent application Ser. No. 13/033,419, filed Feb. 23, 2011, published as US2011/0206992, entitled "Porous Structures for Energy Storage Devices" [S1583.70034US00]; U.S. patent application Ser. No. 13/249,605, filed Sep. 30, 2011, published as US2012/0082872, entitled "Additive for Electrolytes" [S1583.70035US01]; U.S. patent application Ser. No. 13/249,632, filed Sep. 30, 2011, published as US2012/0082901, entitled "Lithium-Based Anode with Ionic Liquid Polymer Gel" [S1583.70036US01]; U.S. Provisional Patent Apl. Ser. No. 61/349,232, filed May 28, 2011, entitled "Use of graphene in lithium/sulphur batteries" [S1583.70038US00]; U.S. Provisional Patent Apl. Ser. No. 61/498,339, filed Jun. 17, 2011, entitled "Plating Technique for Electrode" [S1583.70040US00]; and U.S. patent application Ser. No. 13/216,538, filed Aug. 24, 2011, entitled "Electrolyte Materials for Use in Electrochemical Cells" [S1583.70045US00]. All other patents and patent applications disclosed herein are also incorporated by reference in their entirety for all purposes.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An article for use in an electrochemical cell, comprising:
  a composite structure having a first side and a second, opposing side, the composite structure comprising:
  at the first side, a predominantly lithium metal electroactive portion;
  at the second side, a predominantly lithium nitride portion, wherein
  at a location at least 10 microns from the first side toward the second side, the composite structure is free of $Li_3N$ or has a molar ratio of Li metal to $Li_3N$ of greater than 5:1, and
  at a location at least 1 micron from the second side toward the first side, the composite structure has a molar ratio of Li metal to $Li_3N$ of less than 1:1000 and a lithium ion conductivity of at least $1 \times 10^{-4}$ S/cm, and
  a gradient region comprising both lithium metal and $Li_3N$ between the first side and the second side, the gradient region having a thickness of at least 0.005 microns;
  an electrolyte layer adjacent the lithium nitride portion, wherein the electrolyte layer has a yield strength of greater than 50 N/cm$^2$, and
  wherein the article is under an applied anisotropic force, the anisotropic force having a component normal to a surface of the article, wherein the component defines a pressure of at least 80 N/cm$^2$.

2. An article of claim 1, wherein the article is under an applied anisotropic force, the anisotropic force having a component normal to a surface of the article, wherein the component defines a pressure of at least 160 N/cm$^2$.

3. An article of claim 1, wherein the lithium nitride portion is substantially impermeable to liquids.

4. An article of claim 1, wherein the lithium nitride portion comprises pores.

5. An article of claim 4, wherein at least a portion of the pores of the lithium nitride portion are filled, partially or completely, with a polymer.

6. An article of claim 1, further comprising a polymer layer adjacent the lithium nitride portion.

7. An article of claim 1, wherein the lithium metal portion has a thickness of at least 5 microns.

8. An article of claim 1, wherein the lithium metal is doped with a metal.

9. An article of claim 1, wherein the lithium metal portion is formed at least in part by condensing lithium vapor onto a substrate in the presence of a gaseous material to co-deposit the electroactive portion.

10. An article of claim 9, wherein the gaseous material is selected from one or more of the group consisting of carbon dioxide, acetylene, nitrogen, nitrous oxide, nitrogen dioxide, ethylene, sulfur dioxide, hydrocarbons, alkyl phosphate esters, alkyl sulfite esters, and alkyl sulfate esters.

11. An article of claim 10, wherein the gaseous material is nitrous oxide.

12. An article of claim 1, further comprising a cathode comprising sulfur as an active cathode species.

13. An article of claim 12, wherein the sulfur is elemental sulfur.

14. An article of claim 1, wherein the electrolyte layer comprises a polymer gel and a lithium salt.

15. An article of claim 1, wherein the electrolyte layer has a lithium ion conductivity of at least $1 \times 10^{-4}$ S/cm.

16. An article of claim 1, wherein the electrolyte layer has a yield strength of greater than 160 N/cm$^2$.

17. An article of claim 1, wherein the electrolyte layer has a yield strength of greater than 80 N/cm$^2$.

18. An article of claim 1, wherein the electrolyte layer has a yield strength greater than a yield strength of lithium metal.

19. An article of claim 1, wherein the electrolyte layer has a yield strength of greater than 2 times the normal component of the pressure applied to the article.

20. An article of claim 1, wherein the yield strength of the electrolyte layer is less than 20 times the normal component of the pressure applied to the article.

21. An article of claim 1, further comprising a separator adjacent the electrolyte layer.

22. An article for use in an electrochemical cell, comprising:
  a composite structure comprising:
  a lithium metal electroactive portion present at a first side of the composite structure, the lithium metal electroactive portion having a thickness of at least 10 microns;
  a lithium nitride portion present at a second side of the composite structure, the lithium nitride portion having a thickness of greater than 1 micron and a lithium ion conductivity of at least $1 \times 10^{-4}$ S/cm; and
  a gradient region comprising both lithium metal and $Li_3N$ between the first side and the second side, the gradient region having a thickness of at least 0.005 microns;
  an electrolyte layer adjacent the lithium nitride portion, wherein the electrolyte layer has a yield strength of greater than 50 N/cm$^2$, and
  wherein the article is under an applied anisotropic force, the anisotropic force having a component normal to a surface of the article, wherein the component defines a pressure of at least 80 N/cm$^2$.

23. An article of claim 22, wherein the lithium nitride portion is substantially impermeable to liquids.

24. An article of claim 22, wherein the lithium nitride portion comprises pores.

25. An article of claim 24, wherein at least a portion of the pores of the lithium nitride portion are filled, partially or completely, with a polymer.

26. An article of claim 22, further comprising a cathode comprising sulfur as an active cathode species.

27. An article of claim 26, wherein the sulfur is elemental sulfur.

* * * * *

UNITED STATES PATENT AND TRADEMARK OFFICE
CERTIFICATE OF CORRECTION

| | | |
|---|---|---|
| PATENT NO. | : 9,040,197 B2 | Page 1 of 1 |
| APPLICATION NO. | : 13/850437 | |
| DATED | : May 26, 2015 | |
| INVENTOR(S) | : John D. Affinito et al. | |

It is certified that error appears in the above-identified patent and that said Letters Patent is hereby corrected as shown below:

In the Specification

At column 1, line 8 the word "issed" should read -- issued --.

At column 11, line 52 the words "electro active" should read -- electroactive --.

At column 36, line 56 the word "LiCLO$_4$" should read -- LiClO$_4$ --.

Signed and Sealed this
Twenty-ninth Day of September, 2015

Michelle K. Lee
*Director of the United States Patent and Trademark Office*